United States Patent
Gallo

(10) Patent No.: US 8,271,109 B2
(45) Date of Patent: Sep. 18, 2012

(54) METHOD AND APPARATUS FOR DISTORTION OF AUDIO SIGNALS AND EMULATION OF VACUUM TUBE AMPLIFIERS

(76) Inventor: Marc Nicholas Gallo, Bayside, NY (US)

( * ) Notice: Subject to any disclaimer, the term of this patent is extended or adjusted under 35 U.S.C. 154(b) by 1596 days.

(21) Appl. No.: 11/714,289

(22) Filed: Mar. 6, 2007

(65) Prior Publication Data

US 2008/0218259 A1    Sep. 11, 2008

(51) Int. Cl.
  *G06F 17/00* (2006.01)
  *H03G 3/00* (2006.01)
(52) U.S. Cl. ............................ 700/94; 381/61
(58) Field of Classification Search ............ 700/94; 381/61, 106; 330/109, 294; 708/8, 9, 203, 708/274, 277
See application file for complete search history.

(56) References Cited

U.S. PATENT DOCUMENTS

| | | | |
|---|---|---|---|
| 3,835,409 A | 9/1974 | Laub | |
| 4,243,943 A * | 1/1981 | Cherry | ............ 330/100 |
| 4,405,832 A | 9/1983 | Sondermeyer | |
| 4,495,640 A | 1/1985 | Frey | |
| 4,672,671 A | 6/1987 | Kennedy | |
| 4,710,727 A | 12/1987 | Rutt | |
| 4,811,401 A | 3/1989 | Brown, Sr. et al. | |
| 4,852,444 A | 8/1989 | Hoover et al. | |
| 4,868,869 A | 9/1989 | Kramer | |
| 4,949,177 A | 8/1990 | Bannister et al. | |
| 4,991,218 A | 2/1991 | Kramer | |
| 4,995,084 A | 2/1991 | Pritchard | |
| 5,032,796 A | 7/1991 | Tiers et al. | |
| 5,131,044 A | 7/1992 | Brown, Sr. et al. | |
| 5,248,844 A | 9/1993 | Kunimoto | |
| 5,321,325 A | 6/1994 | Lannes | |
| 5,524,055 A | 6/1996 | Sondermeyer | |
| 5,528,532 A | 6/1996 | Shibutani | |
| 5,570,424 A | 10/1996 | Araya et al. | |
| 5,578,948 A | 11/1996 | Toyama | |
| 5,596,646 A | 1/1997 | Waller, Jr. et al. | |
| 5,619,578 A | 4/1997 | Sondermeyer et al. | |
| 5,647,004 A | 7/1997 | Sondermeyer et al. | |
| 5,748,747 A | 5/1998 | Massie | |
| 5,789,689 A | 8/1998 | Doidic et al. | |
| 5,802,182 A | 9/1998 | Pritchard | |
| 5,923,767 A * | 7/1999 | Frindle et al. | ............ 381/106 |
| 6,350,943 B1 | 2/2002 | Suruga et al. | |
| 6,504,935 B1 | 1/2003 | Jackson | |
| 6,611,854 B1 | 8/2003 | Amels | |
| 8,065,129 B1 * | 11/2011 | Rahmat et al. | ............ 703/14 |
| 2006/0248518 A1 * | 11/2006 | Kundert | ............ 717/140 |

OTHER PUBLICATIONS

Appendix of Patent Rules.*

* cited by examiner

*Primary Examiner* — Davetta W Goins
*Assistant Examiner* — Daniel Sellers

(57) ABSTRACT

A method for digitally processing audio signals to emulate the effects of vacuum tube amplifiers and preamplifiers, musical instrument amplification systems, and distortion effects. By use of a parametrically-controlled non-linear transfer function, non-linear filters, feedback elements, and power-law function models, the dynamic behavior and distortion effects of tube amplification stages are simulated. This provides users with the capability to reproduce the desired sounds of vintage and modern tube amplifier systems and effects with the conveniences and control associated with digital signal processing systems and software.

17 Claims, 20 Drawing Sheets

METHOD AND APPARATUS FOR DISTORTION OF AUDIO SIGNALS AND EMULATION OF VACUUM TUBE AMPLIFIERS

CROSS-REFERENCE TO RELATED APPLICATIONS

The following U.S. Patents relate to the present invention and are provided for reference.

| | | |
|---|---|---|
| 3,835,409 | September 1973 | Laub |
| 4,405,832 | September 1983 | Sondermeyer |
| 4,495,640 | January 1985 | Frey |
| 4,672,671 | June 1987 | Kennedy |
| 4,710,727 | December 1987 | Rutt |
| 4,811,401 | March 1989 | Brown Sr. et al. |
| 4,852,444 | August 1989 | Hoover et al. |
| 4,868,869 | September 1989 | Kramer |
| 4,949,177 | August 1990 | Bannister et al. |
| 4,991,218 | February 1991 | Kramer |
| 4,995,084 | February 1991 | Pritchard |
| 5,032,796 | July 1991 | Tiers et al. |
| 5,131,044 | July 1992 | Brown Sr. et al. |
| 5,248,844 | September 1993 | Kunimoto |
| 5,321,325 | June 1994 | Lannes |
| 5,524,055 | June 1996 | Sondermeyer |
| 5,528,532 | June 1996 | Shibutani |
| 5,570,424 | October 1996 | Araya et al. |
| 5,578,948 | November 1996 | Toyama |
| 5,596,646 | January 1997 | Waller Jr. et al. |
| 5,619,578 | April 1997 | Sondermeyer et al. |
| 5,647,004 | July 1997 | Sondermeyer et al. |
| 5,748,747 | May 1998 | Massie |
| 5,789,689 | January 1997 | Doidic et al. |
| 5,802,182 | September 1998 | Pritchard |
| 6,350,943 | February 2002 | Suruga et al. |
| 6,504,935 | January 2003 | Jackson |
| 6,611,854 | August 2003 | Amels |

FIELD OF INVENTION

The present invention relates generally to audio signal processing, audio recording software, guitar amplification systems, and modeling of vacuum tubes. More particularly, the present invention concerns a signal processing method designed to distort audio signals and mimic the desired audio characteristics, dynamics, and distortion associated with vacuum tube preamplifier stages and power amplifiers.

BACKGROUND OF INVENTION

Prior attempts to emulate the effects of vacuum tubes with software-based or digital tube-modeling algorithms have failed to fully capture the characteristics of these distortions and faithfully reproduce the dynamic and "warm" sound associated with tube amplifiers. The effects of the cathode-connected R-C network commonly found in tube amplifier stages have been overly simplified in previous art. By use of a chain of linear filters and distortion blocks, the true non-linear dynamical behavior of tube amplifier stages is lost. Many non-linear transfer functions are described by fixed equations and lack means of adjustment of their shape, linear regions, and clipping characteristics. Furthermore, little progress has been made to simplify the non-linear functions used to distort digital signals in these algorithms to improve their computational efficiency and permit greater numbers of them to run on signal processors. While prior examples to capture the characteristics of tube amplifier stages have been successful on many grounds, they either lack the parametric control, versatility, dynamic character, or computational simplicity of the present invention.

U.S. Pat. No. 4,995,084 to Pritchard (Feb. 19, 1991) relates analog circuits to vacuum tube amplifiers and discloses one of the earliest digital versions that approximate the distortion of these circuits. Clipping is achieved with a basic hard-clipping algorithm and does not address controlling the curvature of the clipping regions parametrically. No attention is given to the dynamic distortion effects of tube amplification stages or the elimination of fold-over noise.

U.S. Pat. No. 6,504,935 to Jackson (Jan. 7, 2003) and U.S. Pat. No. 6,611,854 to Amels (Aug. 26, 2003) disclose transfer curves based on trigonometric functions and high-order polynomials which, although allow great versatility in control of harmonic content, take greater efforts to compute. U.S. Pat. No. 5,570,424 to Araya et al. (Oct. 29, 1996), U.S. Pat. No. 5,578,948 to Toyama (Nov. 26, 1996) and U.S. Pat. No. 6,350,943 to Suruga et al. (Feb. 26, 2002) use cubic polynomial functions that are relatively easier to compute but lack a strictly linear region and adjustment of the clipping edge.

U.S. Pat. No. 5,789,689 to Doidic et al. (Aug. 4, 1998) discloses a digital guitar amplifier utilizing several transfer functions to model vacuum tube preamplifier stages. In addition to a hard-clipping function, a fixed curve closely approximating a vacuum tube transfer characteristic is described. However, despite the accuracy of the shape of this model curve, it lacks the parametric control, dynamics, linear regions and computational simplicity of the present invention.

U.S. Pat. No. 4,868,869 to Kramer (Sep. 19, 1989) and U.S. Pat. No. 5,528,532 to Shibutanti (Jun. 18, 1996) are just two of many examples disclosing digital distortion methods implementing non-linear transfer functions using lookup tables located in digital memory. Whereas table lookup methods are extremely computationally efficient, requiring only a single memory read for each processed sample, they don't address or improve the functions with which the tables are filled, nor do they provide means for dynamic or parametric control of the table values. Also, trends for higher sampling resolutions demand lookup tables of impractically large sizes.

U.S. Pat. No. 4,495,640 to Frey (Jan. 22, 1985) recognizes the importance of controlling the gain and offset bias within and between tube amplifier stages for adjustable guitar distortion and implements this in analog circuitry using operational amplifiers between vacuum tube amplifier stages.

U.S. Pat. No. 4,811,401 and U.S. Pat. No. 5,131,044 to Brown et al. (Mar. 7, 1989 and Jul. 14, 1992) demonstrate the need for frequency-dependent control of distortion and highlight, through analog means, the trend for increased forward gain for higher audible frequencies and the high-shelving filter effect. This effect is an inherent property of tube amplifier stages with cathode-connected R-C components. Whereas it is often demonstrated how to simulate this high frequency boost effect with linear filters, the linear filter approach fails to emulate the non-linear dynamical behavior resulting from the feedback effects of the cathode-connected R-C network.

In addition to models of single preamplifier tubes, the value of push-pull amplifier configurations for tube amplifier emulation has been demonstrated in several places in prior art. U.S. Pat. No. 5,321,325 to Lannes (Jun. 14, 1994) discloses a method for adapting a single input to a push-pull configuration which applies to tube- or transistor-based amplifiers aimed at reducing even-order harmonics and accentuating odd-order harmonics. Methods for reproducing crossover distortion by analog means are disclosed in U.S. Pat. No.

3,835,409 to Laub (Sep. 10, 1974), and demonstrate the motivation in the art for reproducing the effects of push-pull power amplifiers for distortion circuits for guitar. U.S. Pat. No. 5,524,055 to Sondermeyer (Jun. 4, 1996) reveals another analog approach to push-pull power amplifier emulation focusing on the power compression effects and soft clipping it produces. None of these examples, however, disclose methods for digitally emulating these effects or for equations to model the transfer functions of power tubes and push-pull power amplifiers.

It has been demonstrated that there is a need in the art for an efficient signal processing method to faithfully reproduce the desired dynamic and distortion effects associated with vacuum tube amplifiers and to provide a means of controlling this emulation via a set of meaningful parameters. The interest to achieve these results has been expressed many times in prior works and has been satisfied by the present invention in an efficient, simple, and readily usable form.

SUMMARY OF INVENTION

It is an object of this invention to provide a means of distortion of audio signals through a signal process.

It is a further object of this invention to recreate the desirable dynamic distortion effects of vacuum tube preamplifier and power amplifier stages by means of a digital signal process.

It is still a further object of this invention to provide a means of emulating tube preamplifier and power amplifier stages in terms of equations and algorithms that can be readily implemented in software or signal processing hardware.

It is still a further object of this invention to incorporate a plurality of said tube preamplifier and amplifier modeling stages in conjunction with linear filters and other effects to provide a means of emulating a tube amplification system, guitar amplification system, or other musical instrument signal processor.

It is still a further object of this invention to emulate the input-output transfer characteristic curve of a vacuum tube amplifier stage by means of a non-linear transfer function.

It is still a further object of this invention to provide a means for parametric control of the linear region, curvature, and symmetry of said non-linear transfer function to allow emulation of a variety of tube amplification stages and distortion effects.

It is still a further object of this invention to provide a means of adjusting the size and position of the linear region of said non-linear transfer function through the selection of edge and symmetry control parameters.

It is still a further object of this invention to provide a means of adjusting the gain and offset of the input and output signals of said non-linear transfer function to emulate the high signal gain and bias effects of tube amplification stages.

It is still a further object of this invention to provide a means to modulate the offsets of the input and output signals of said non-linear transfer function by the input signal envelope or other signals.

It is still a further object of this invention to emulate the effects of the cathode-connected R-C network of tube amplifier stages by means of a non-linear filter model incorporating a dependent current source, R-C filter, and feedback control.

It is still a further object of this invention to provide a means of adjusting the dynamic behavior of said non-linear filter model through a set of parameters that relate the feedback and filter coefficients to the values of the R-C network components in actual tube amplifier stage circuits.

It is still a further object of this invention to provide a means of adjusting the frequency response of said non-linear filter through the selection of cutoff frequency and dc-gain parameters and to relate these parameters to the values of the components of said R-C network.

It is still a further object of this invention to provide a means of modeling said non-linear filter by means of a non-linear differential equation.

It is still a further object of this invention to provide a means of solving said non-linear differential equation in real-time using a step-method numerical integration solver.

It is still a further object of this invention to reduce foldover noise and aliasing artifacts by means of the up-sampling and filtering traits inherent in said step-method numerical integration solver.

It is still a further object of this invention to emulate the input-output characteristic curve of a power vacuum tube by means of a power-law transfer function.

It is still a further object of this invention to provide a means of adjusting the exponent and bias threshold point of said power-law transfer function.

It is still a further object of this invention to provide a means to modulate the bias threshold of said power-law transfer function by the input signal envelope or other signals.

It is still a further object of this invention to emulate a single-ended power amplifier by means of said power-law transfer function.

It is still a further object of this invention to emulate a push-pull power amplification stage by means of two said power-law transfer functions.

It is still a further object of this invention to provide a means of controlling the crossover distortion of said push-pull amplification stage by adjusting the bias threshold points and overlap of two said power-law transfer functions.

It is still a further object of this invention to provide a means of modulating the amount of crossover distortion and bias threshold points of said push-pull amplifier stage by the input signal envelope or other signals.

BRIEF DESCRIPTION OF THE DRAWINGS

For a better understanding of the present invention, reference may be had to the following description of exemplary embodiments thereof, considered in conjunction with the accompanying drawings, in which.

DETAILED DESCRIPTION OF THE INVENTION

Figure 1:
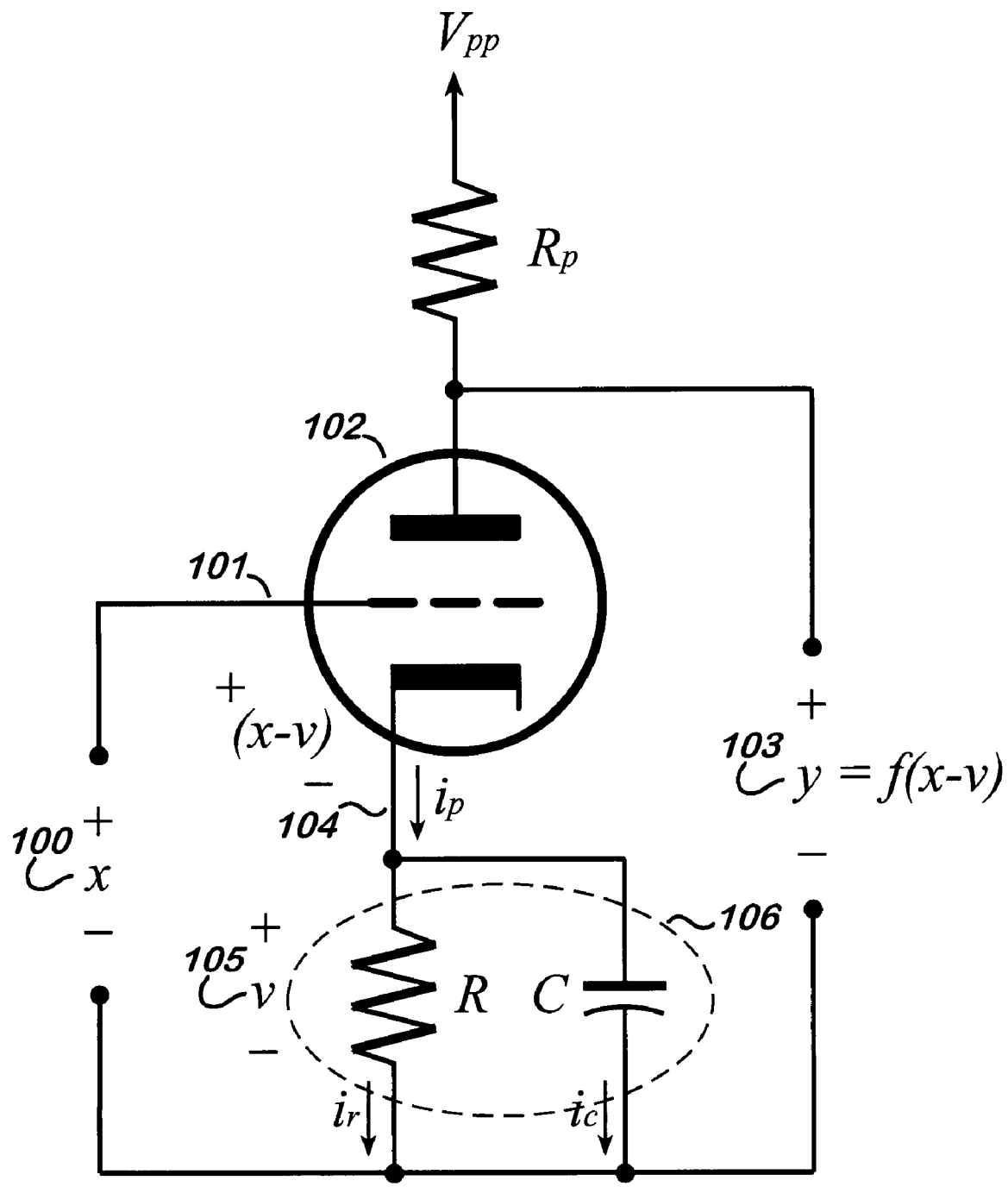
FIG. 1 is a schematic drawing of a tube amplifier stage.

Referring to FIG. 1, a schematic of a tube amplifier stage is shown. An input signal 100 feeds the grid 101 of a vacuum tube 102 producing an output signal 103. The output signal 103 is dependent on the plate current of the tube, which is controlled by the voltage difference between the grid 101 and cathode 104. The voltage at the grid 101 is equivalent to the input signal 100, represented by x, and the voltage at the cathode 105 is represented by v. The output signal 103 is then proportional to a function of the difference, (x−v). This function, $f(x-v)$, as it is modeled by the present invention, is referred to as a transfer function. Additionally, the R-C network 106 found at the cathode 104 relates the plate current to the voltage at the cathode 105 which, in turn, affects the plate current. This recursive relationship of the output to the cathode voltage reveals a feedback phenomenon that occurs in tube amplifier stages and is important to the models of the present invention.

Figure 2:
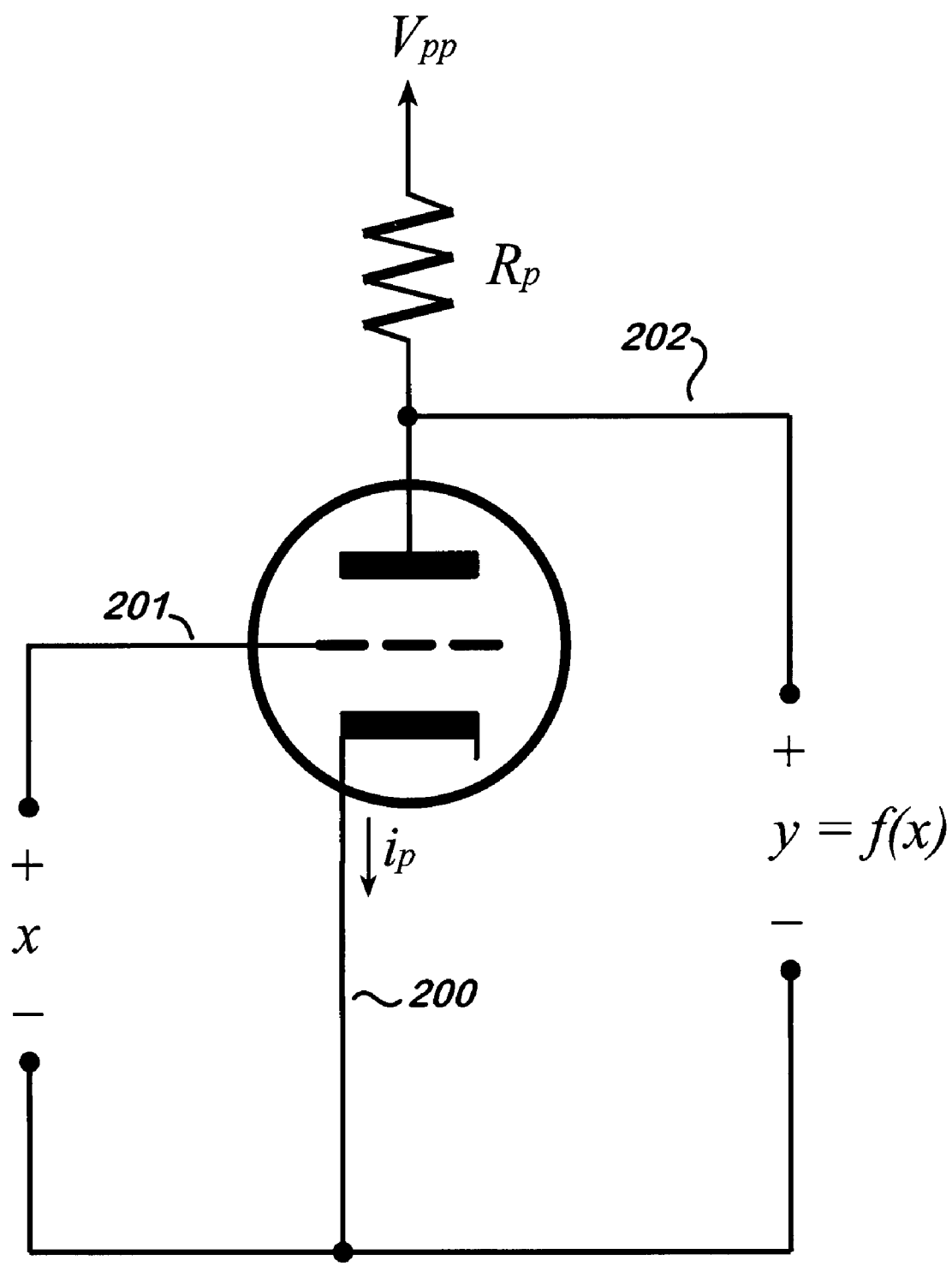
FIG. 2 is a schematic drawing of a simplified tube amplifier stage with a grounded cathode.

Referring to FIG. 2, a schematic of a simplified tube amplifier stage is shown. In this circuit, the cathode 200 has been grounded to allow easier measurement and analysis of the transfer function of the tube amplifier stage by eliminating the feedback effects of the cathode-connected R-C network. With a grounded cathode, the plate current is now only a function of the grid voltage 201, and, since variations of the plate current solely determine variations in the output voltage 202, the grid voltage 201 directly controls the output voltage 202. The transfer function of the tube amplifier can now readily be measured by recording the output voltage 202 for various values of grid voltage 201.

Figure 3:
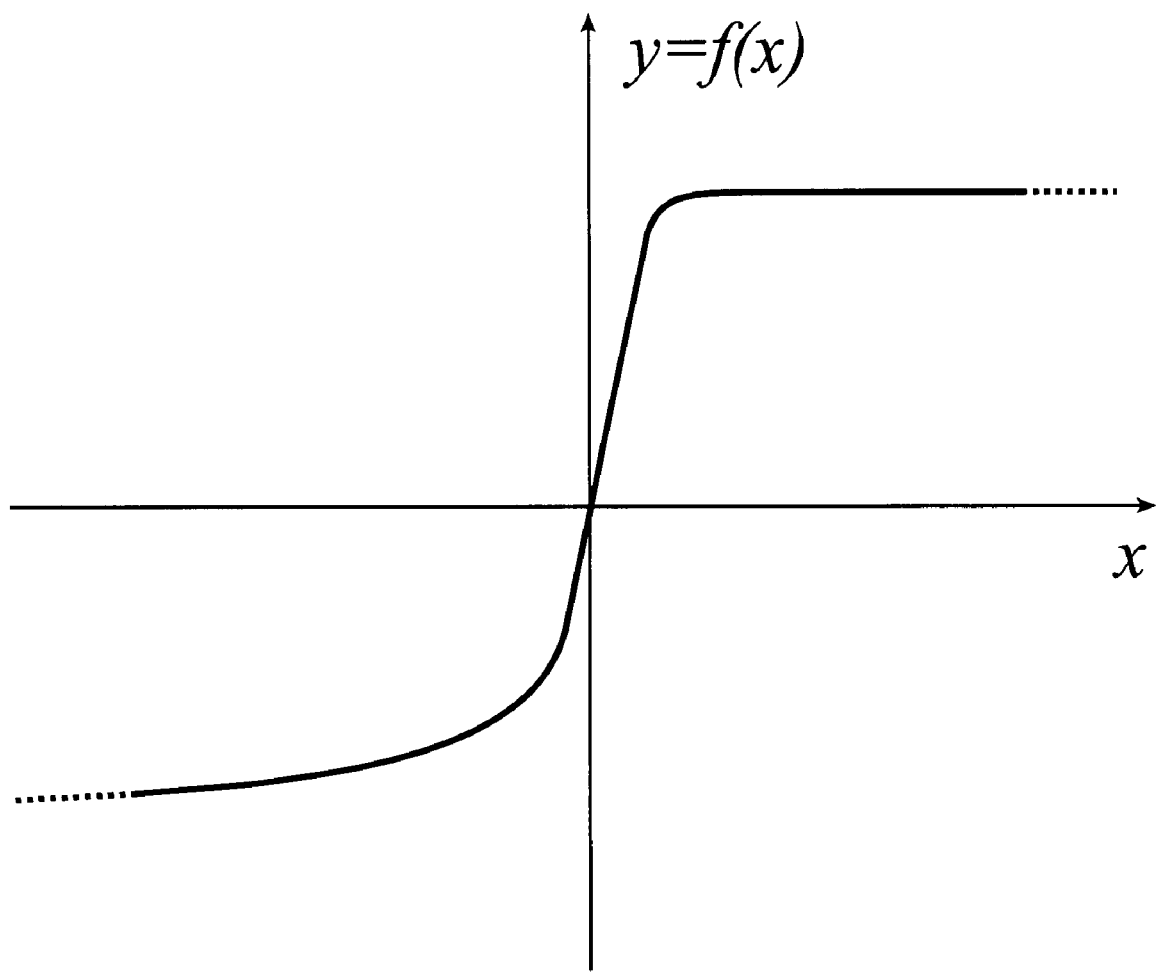
FIG. 3 is a graph of a non-linear transfer characteristic relating the input and output of a tube amplifier stage.

Referring to FIG. 3, a graph of the transfer function representing the input-output relationship of a tube amplification stage simplified by a grounded cathode is shown. The x-axis represents the input grid voltage and the y-axis represents the output plate current at any given instant of time. For convenience, the axes have been scaled and shifted to center the graph about the origin and the y-axis has been inverted to reverse the inverting property of the tube amplification stage. The acceptable input signal range extends without bound from −∞ to +∞, while the output signal range is restricted to minimum and maximum limits. Near the origin, $f(x)$ is mostly linear, enabling input signals of small amplitude to pass to the output mostly undistorted. Larger values of the input experience gain reduction where signal clipping and distortion results. The rate of gain reduction can be sudden or slow and is shown by the curvature of the transfer function near the output limits. Furthermore, positive half-cycles and negative half-cycles may distort asymmetrically as is shown by the transfer function's lack of odd-symmetry. The present invention incorporates these properties into a model of the transfer function.

Figure 4A:
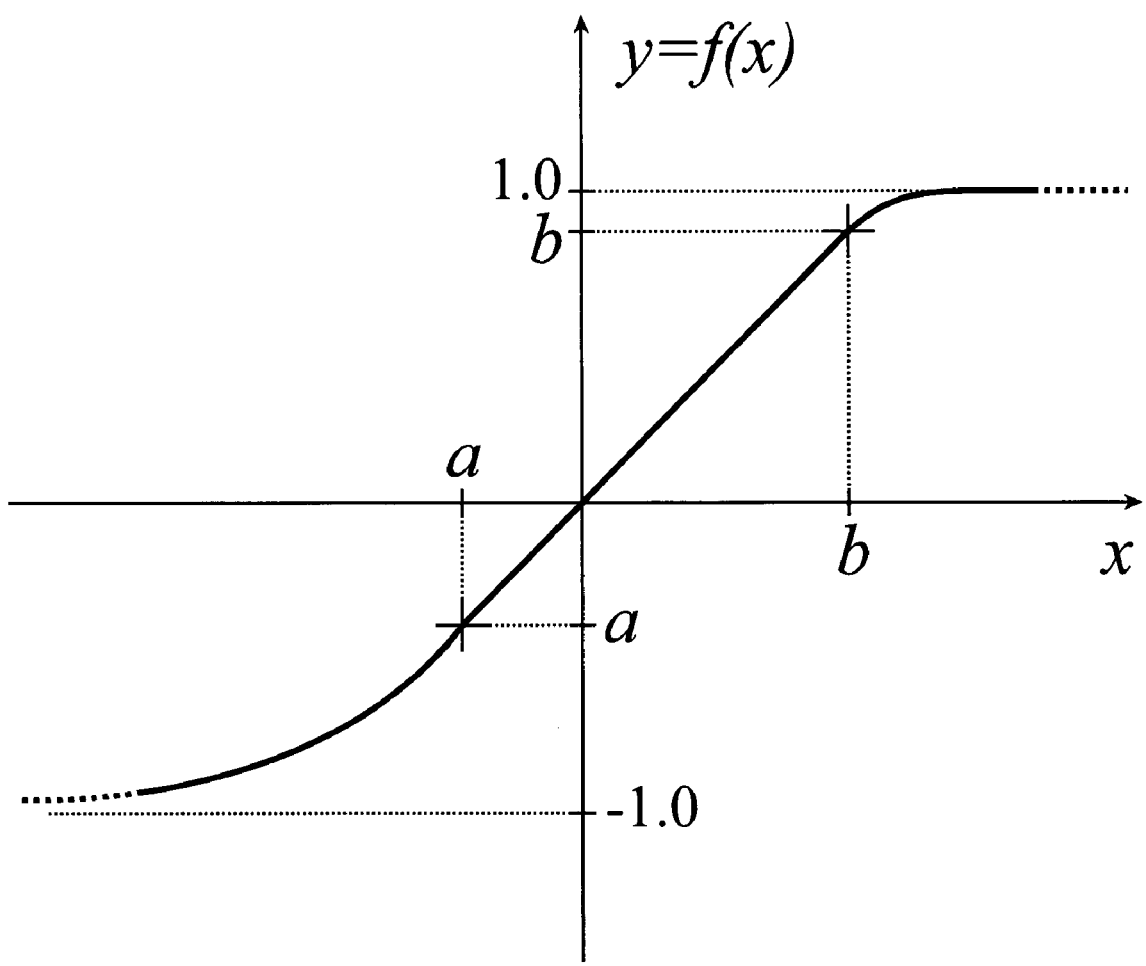
FIG. 4A is a graph of a parametrically defined non-linear function used to model the transfer characteristic of a tube amplifier stage.

Referring to FIG. 4A, a non-linear transfer function of the present invention is shown. This function is divided into three regions by boundaries placed at two points, a and b. For small input signals, x lies between the boundary points, a and b, $$a \leq x \leq b,$$

and the output, y, is simply a linear function of the input, $$y=x.$$

This linear region does not distort small signals, which mimics the same effect found in tube amplifier stages. For large negative signal swings, x is less than the lower-boundary, a, $$x<a,$$

and the output, y, is a non-linear function of the input, $$y = \frac{(k_1 + x)}{(k_2 - x)}, \text{ where } k_1 = a^2, k_2 = 1 + 2a.$$

This function possesses a smooth horizontal asymptote at y=−1.0 as x decreases below a towards negative infinity. This prevents negative values of y from decreasing below a fixed saturation limit, mimicking the same effect in tube amplifier stages. The values of $k_1$ and $k_2$ are chosen to scale and shift the asymptotic non-linear section so that the transfer function and its slope remain continuous across the boundary, a. This continuity of both function and slope insures a smooth transition from the linear region to the lower clipping region, mimicking the same effect found in tube amplifier stages. Similarly, for large positive signal swings, x is greater than the upper-boundary, b, $$x>b,$$

and the output, y, is another non-linear function of the input, $$y = \frac{(x - k_3)}{(x + k_4)}, \text{ where } k_3 = b^2, k_4 = 1 - 2b.$$

This function possesses a smooth horizontal asymptote at y=+1.0 as x increases above b towards positive infinity. This prevents positive values of y from increasing above a fixed saturation limit, mimicking the same effect found in tube amplifier stages. The values of $k_3$ and $k_4$ are similarly chosen to scale and shift the asymptotic non-linear section so that the transfer function and its slope remain continuous across the boundary, b. This continuity of both function and slope insures a smooth transition from the linear region to the upper clipping region, mimicking the same effect found in tube amplifier stages.

The values of a and b may be freely chosen between −1.0 and +1.0 to produce many different types of distortions and transfer functions, both those found in tube amplifier stages, and those found in other distortion devices.

Figure 4B:
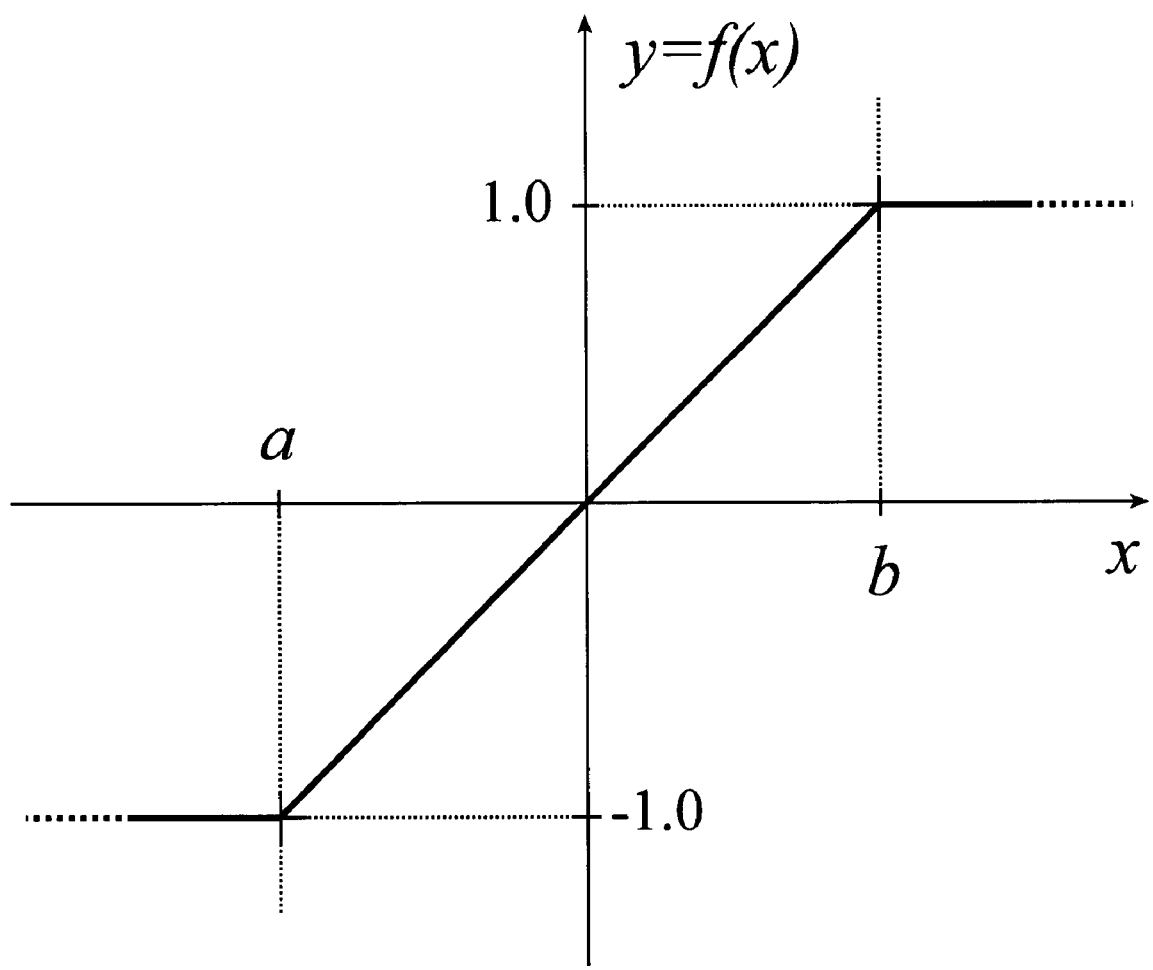
FIG. 4B is a graph of a non-linear transfer function with symmetrical hard-clipping.

FIG. 4B shows a particular case when a=−1.0 and b=+1.0 that produces symmetrical hard-clipping. In this case, the linear region is maximized, and the function enters into the clipping regions instantaneously. This transfer function resembles the transfer characteristic of high-gain tube amplifier stages and mimics their effects.

Figure 4C:
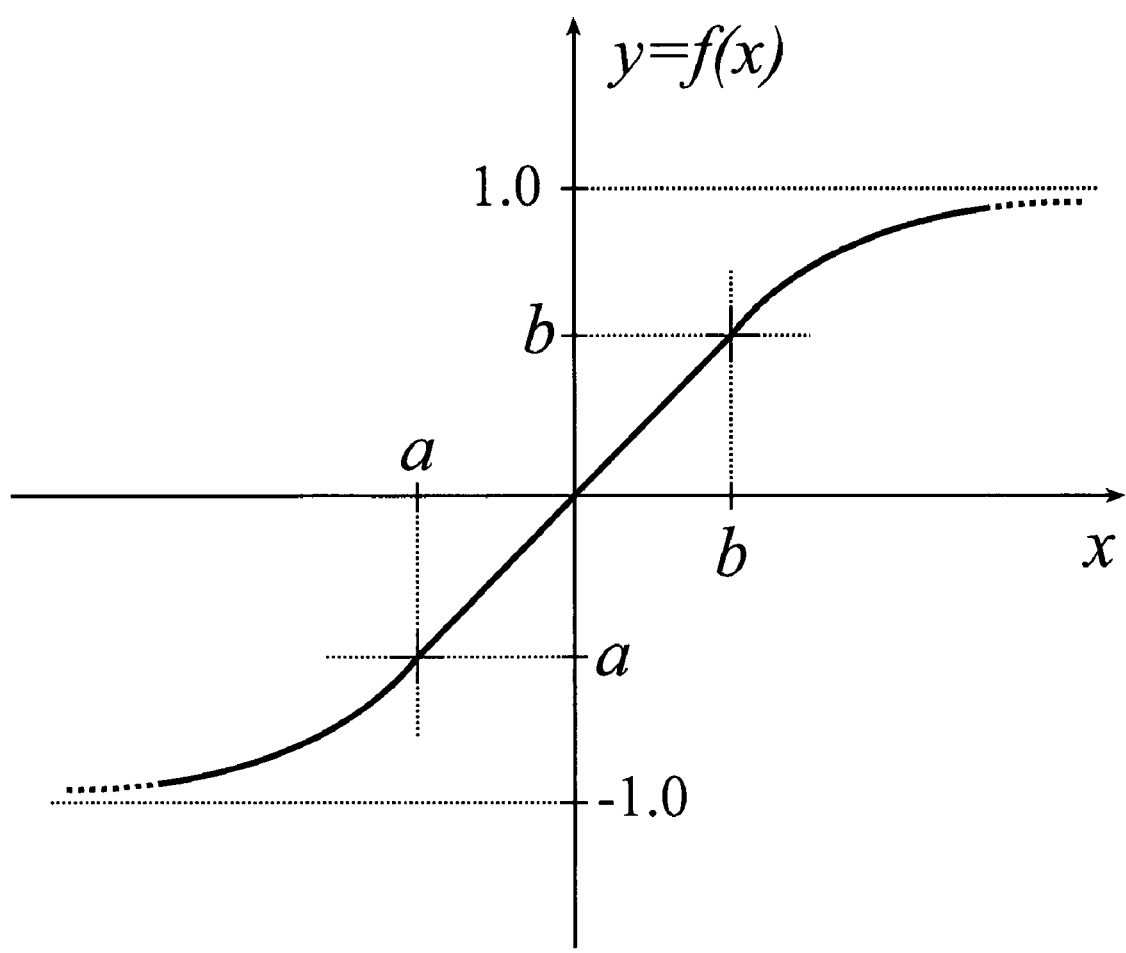
FIG. 4C is a graph of a non-linear transfer function with a controlled amount of symmetrical soft-clipping.

FIG. 4C shows another particular case when a=−b that produces a symmetrical clipping with controllable curvature. Here, the size of the linear region is reduced in exchange for smoother transitions into the clipping regions. Both clipping regions are positioned symmetrically about the origin. This transfer function mimics the effects of lower gain tube amplifier stages and distortion circuits with symmetrical soft-clipping.

Figure 4D:
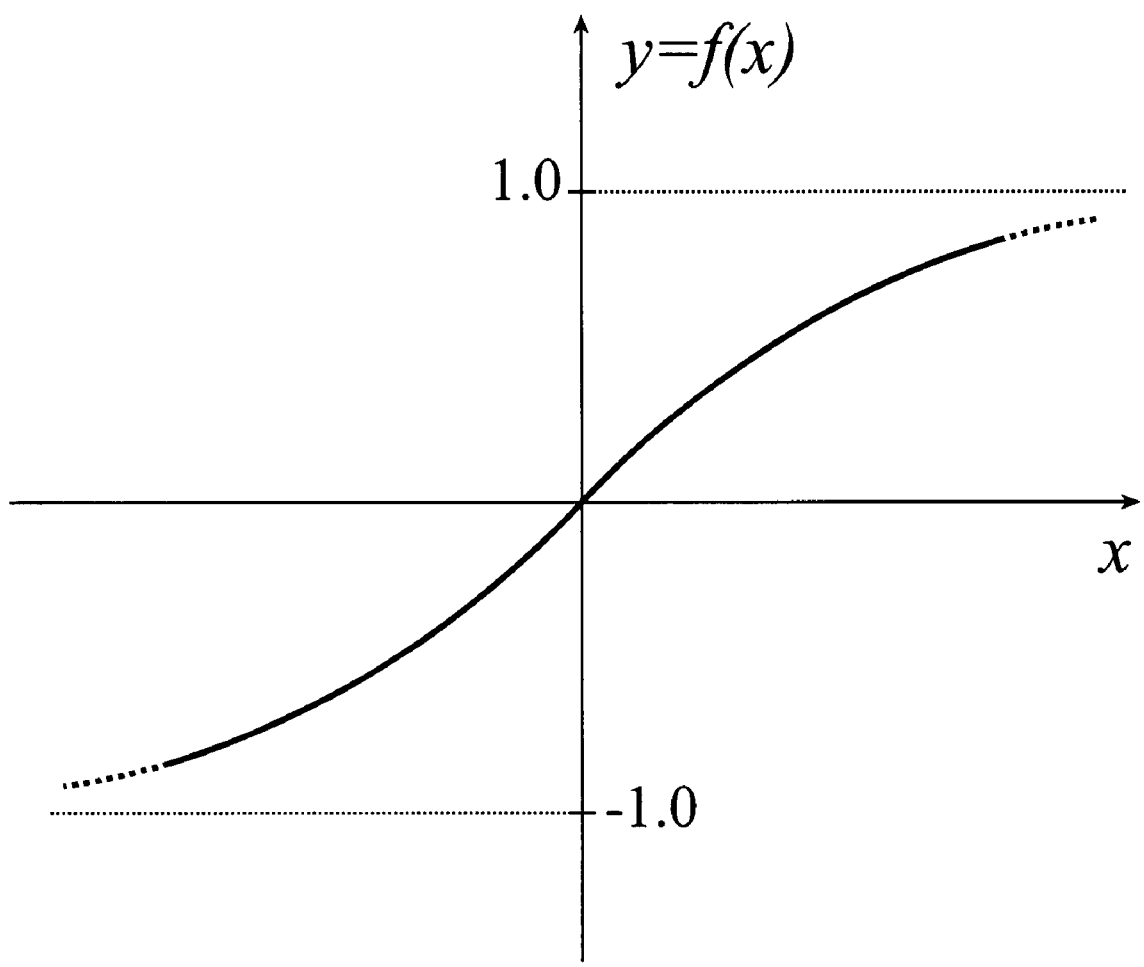
FIG. 4D is a graph of a non-linear transfer function with symmetrical soft-clipping.

FIG. 4D shows another particular case when a=b=0 that produces symmetrical soft-clipping with maximum curvature. In this case, the linear region does not exist and even the smallest input signals experience some level of distortion. This results in a transfer function with the highest curvature and softest clipping, mimicking the effects of soft-clipping power amplifiers and distortion effects.

Figure 4E:
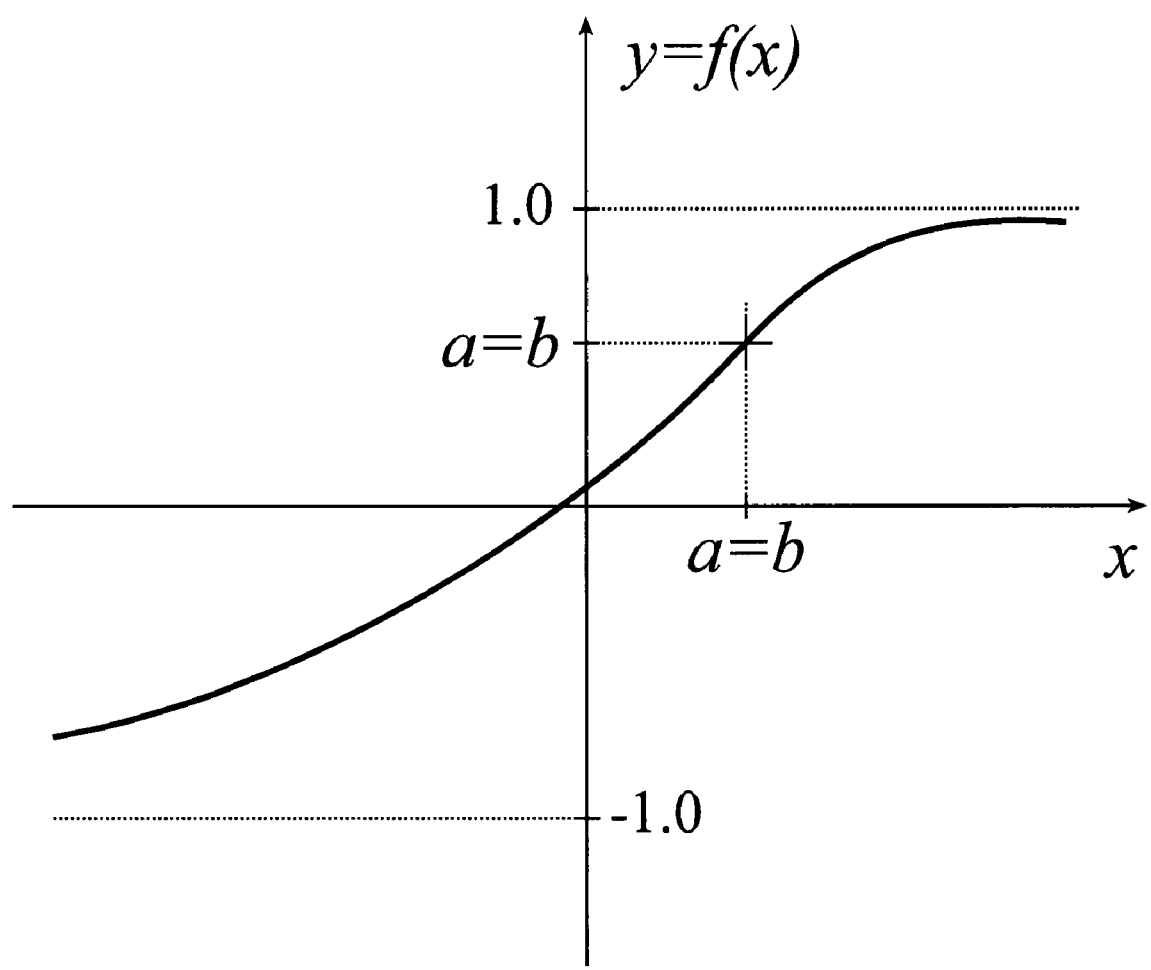
FIG. 4E is a graph of a non-linear transfer function with asymmetrical soft-clipping.

FIG. 4E shows another particular case when a=b≠0 that produces asymmetrical soft-clipping with maximum curvature. As is FIG. 4D, the linear region does not exist and even the smallest input signals experience some level of distortion. Unlike FIG. 4D, however, the transfer function is not symmetrical and produces an asymmetrical soft-clipping. This results in a transfer function with softest clipping and control over the amount of asymmetry, mimicking the effects of soft-clipping power amplifiers and distortion effects with an asymmetrical bias.

As has been demonstrated, the values of a and b greatly affect the shape of the transfer function. To simplify and give greater meaning to the determination of these boundaries, two qualitative parameters, named "edge" and "symmetry", are related to a and b by functions that determine their values.

"Edge" is a parameter, normalized and limited to the range of 0 to 1, that defines how abruptly the transfer function transitions from the linear region into the clipping region. It measures the "sharpness" of the edge of the transfer function at the boundaries, a and b. An applied input signal will clip harder with higher values of "edge" than with lower values. In terms of the boundaries of the transfer function, this parameter affects the relative size of the linear region and therefore determines the value for (b−a). A minimum value for "edge" will result in maximum curvature and a minimum linear region where $$a=b \Rightarrow (b-a)=0.$$

while a maximum value for "edge" will result in minimum curvature, a maximum linear region, and sharpest transitions where $$a=-1, b=1 \Rightarrow (b-a)=2.$$

So, then, the "edge" parameter, referred to by e, will govern the linear region by $$(b-a)=2e.$$

"Symmetry" is a parameter, normalized and limited to the range of −1 to 1, that defines the amount of asymmetry in the transfer function. With (b−a) fixed by the selection of the clipping "edge" parameter, the actual values of b and a are determined by the choice of this second "symmetry" parameter. "Symmetry" sets the position of the linear region of the transfer function, with respect to the origin, to permit control over the balance of the positive half-cycle clipping to the negative half-cycle clipping. With values of "symmetry" near zero, the position of the linear region of $f(x)$ will be centered about the origin, and both positive and negative half-cycles will enter clipping and distort symmetrically. For values of "symmetry" closer to +1, the linear region of $f(x)$ will deviate to the right of the origin, causing a more abrupt saturation of the positive half-cycles than the negative half-cycles resulting in an asymmetrical distortion. Likewise, for values of "symmetry" closer to −1, the linear region of $f(x)$ will deviate to the left of the origin, causing a more abrupt saturation of the negative half-cycles than the positive half-cycles resulting in a similarly asymmetrical distortion. In terms of the boundaries of the transfer function, the "symmetry" parameter, represented by s, determines the position of the linear region. With the size of the linear region given by $$(b-a)=2e,$$

and the size of the interval in which this linear region can be moved given by $$1-(-1)=2,$$

the available space that the linear region can be positioned within is $$2-2e.$$

Therefore, the center of the linear region can be positioned as much as half of this amount to the left or to the right of the origin. Defining the center of the linear region as c, it can take values in the range $$-(1-e) \leq c \leq (1-e).$$

Allowing the "symmetry" parameter, s, to take on values ranging from −1 to 1, the center of the linear region may be found by $$c=s(1-e).$$

The boundaries, a and b, can be found by subtracting or adding the half-width of the linear region, e, to the center of the linear region, c.

$$a=c-e$$

$$b=c+e$$

Substituting c from above, we have $$a=s(1-e)-e=s-es-e$$

$$b=s(1-e)+e=s-es+e$$

Thus, the boundaries, a and b, are determined from the parameters, e and s.

Figure 4F:
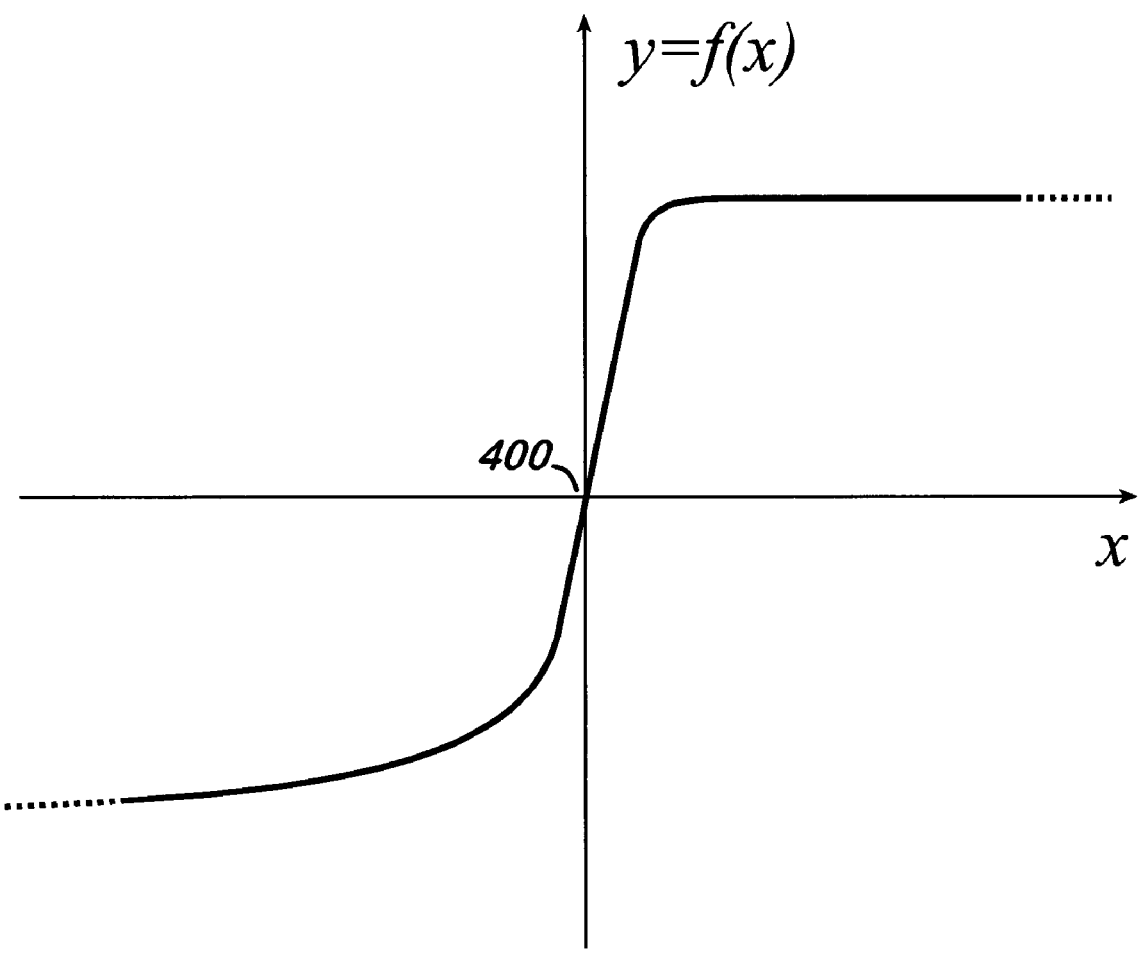
FIG. 4F is a graph of a non-linear transfer function scaled for increased signal gain.
Figure 4G:
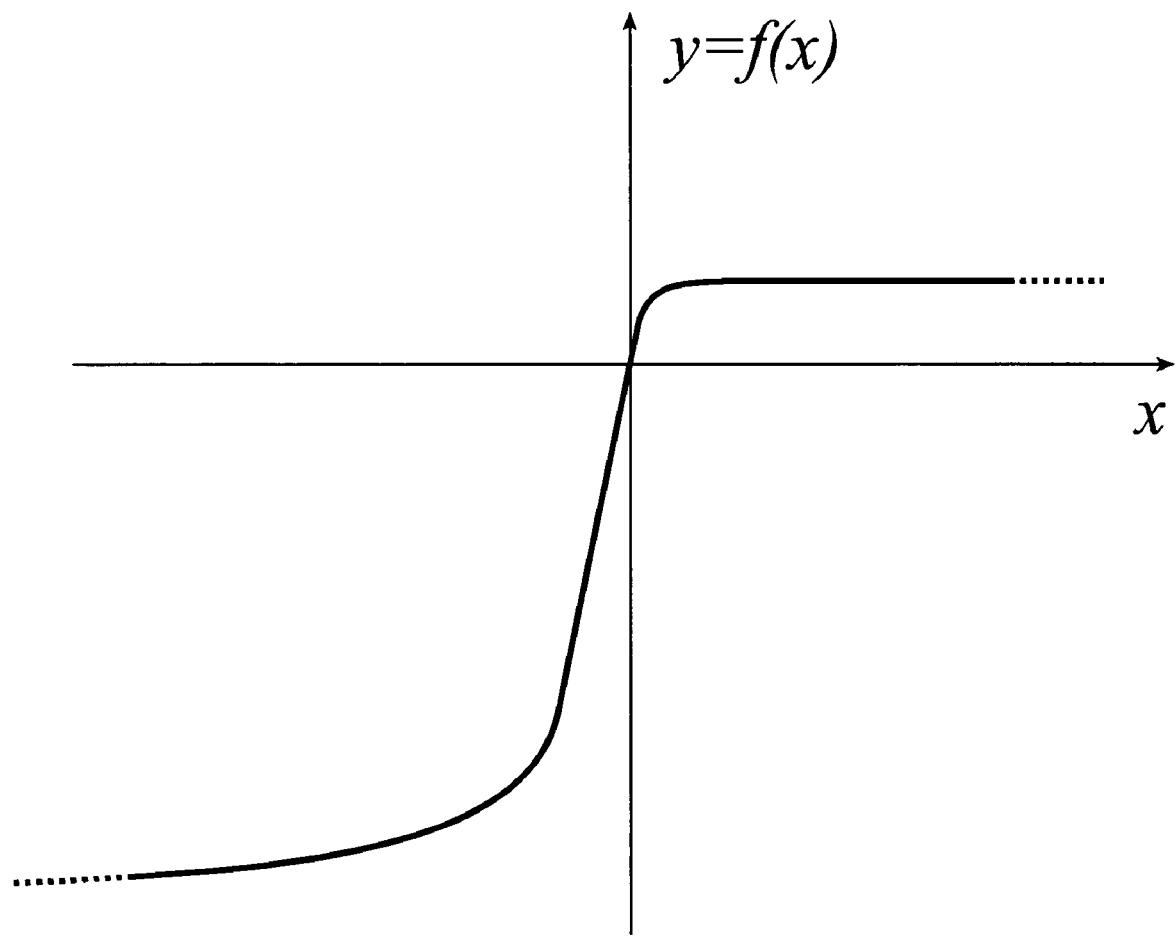
FIG. 4G is a graph of a non-linear transfer function with offsets added to the input and output signals.

To provide a means to emulate the high gain associated with tube amplifier stages, adjustment of the gain and saturation limits of a tube amplifier stage is easily obtained by scaling the input and output signals to the transfer function. FIG. 4F shows a transfer function scaled for increased signal gain, represented by the slope of the function at the origin 400. Additionally, to emulate the biasing sometimes present between tube amplification stages, offsets to the input and output signals may be added. FIG. 4G shows the effect on the transfer function after offsets have been added to the input and output signals. By selecting offsets that reposition the origin along the transfer function, an asymmetrical bias can be defined without a dc-component at the output. Furthermore, these offsets may be modulated by the input envelope, or other signal, for interesting dynamic effects.

Figure 5:
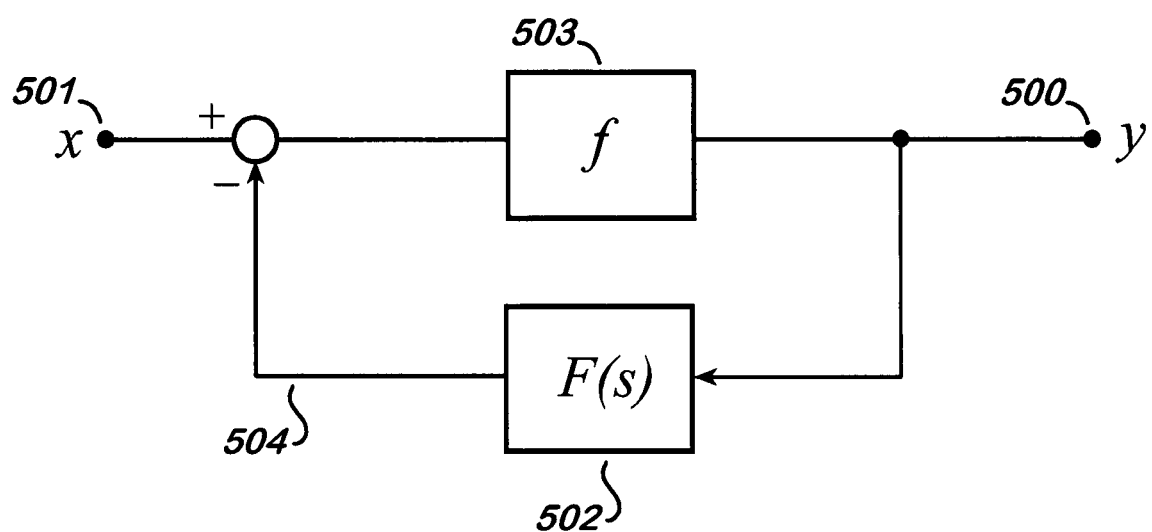
FIG. 5 is a signal flow diagram of a tube amplifier stage model.

Referring to FIG. 5, a signal flow diagram describing the model of a tube amplifier stage with a cathode-connected R-C network is shown. With the R-C network reintroduced, the system output 500 is now dependent upon both the system input 501 and the voltage from the R-C network, emulated by a linear filter block 502. The system output 501 gets its signal from the output of the transfer function block 503. The input to the transfer function block 503 is fed by the difference of the system input 501 and the feedback signal 504. The feedback signal 504 is generated by filtering the system output 500 with the linear filter block 502. The resulting system describes a non-linear filter that emulates the behavior of a tube amplifier stage with a cathode-connected R-C network.

Figure 6:
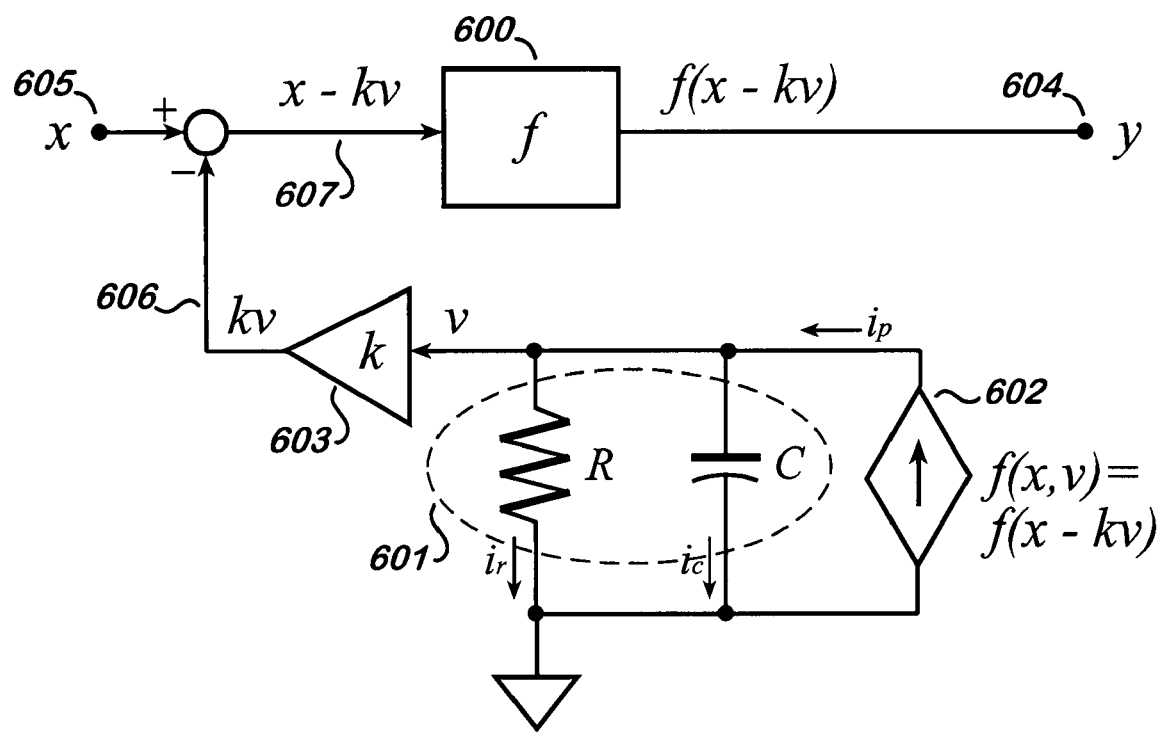
FIG. 6 is a signal flow diagram of a non-linear filter.

Referring to FIG. 6, a signal flow block diagram representing a non-linear filter designed to emulate a tube amplifier stage is shown. This non-linear filter comprises a non-linear transfer function 600, an R-C network 601, a dependent current source 602, and a feedback control 603. The output signal 604 is produced by applying the transfer function 600 to the difference of the input signal 605 and feedback signal 606. The feedback signal is generated by the R-C network 601, which derives its input from the dependent current source 602 proportional to the output signal 604. The gain of the feedback signal is adjusted by the feedback control 603. This arrangement is designed to add dynamic characteristics and spectral control to the static transfer function, mimicking the same effect found in real tube amplifier stages. The non-linear function block 600, located in the forward path of the system diagram, implements a parametrically-controlled non-linear transfer function. The input to the non-linear function block 607, representing the grid-to-cathode voltage that determines the plate current, results from the difference of the system input signal 605, represented by x, and the feedback input signal 606, represented by the product, kv. Here, signal x corresponds to the grid voltage and signal kv corresponds to the voltage across a cathode-connected R-C network, as found in typical tube amplifiers. The linear R-C network 601 and dependent current source 602, located in the feedback loop of the system diagram, recreate the effects of the cathode-connected R-C network by generating signal v by filtering the output, y. This entire system and signal flow diagram represents a non-linear filter that emulates the desired distortion and dynamic effects of vacuum tube amplifier stages.

The choice of values for the R-C network and feedback control parameters affect the frequency response of the amplifier stage. This is an important feature of tube amplifier stages that permits control over the balance of high-frequency distortion to low-frequency distortion. In most tube amplifiers, reduction of low frequency distortion is an inherent effect often desired to achieve a particular, popular sound. Sometimes this is accomplished through filters between tube amplifier stages, but often originates from the careful selection of component values in the cathode-connected R-C networks of each in a succession of stages. The present invention provides a means to emulate this effect and to relate the values of the components of the R-C network to useful parameters of the frequency response.

Figure 7:
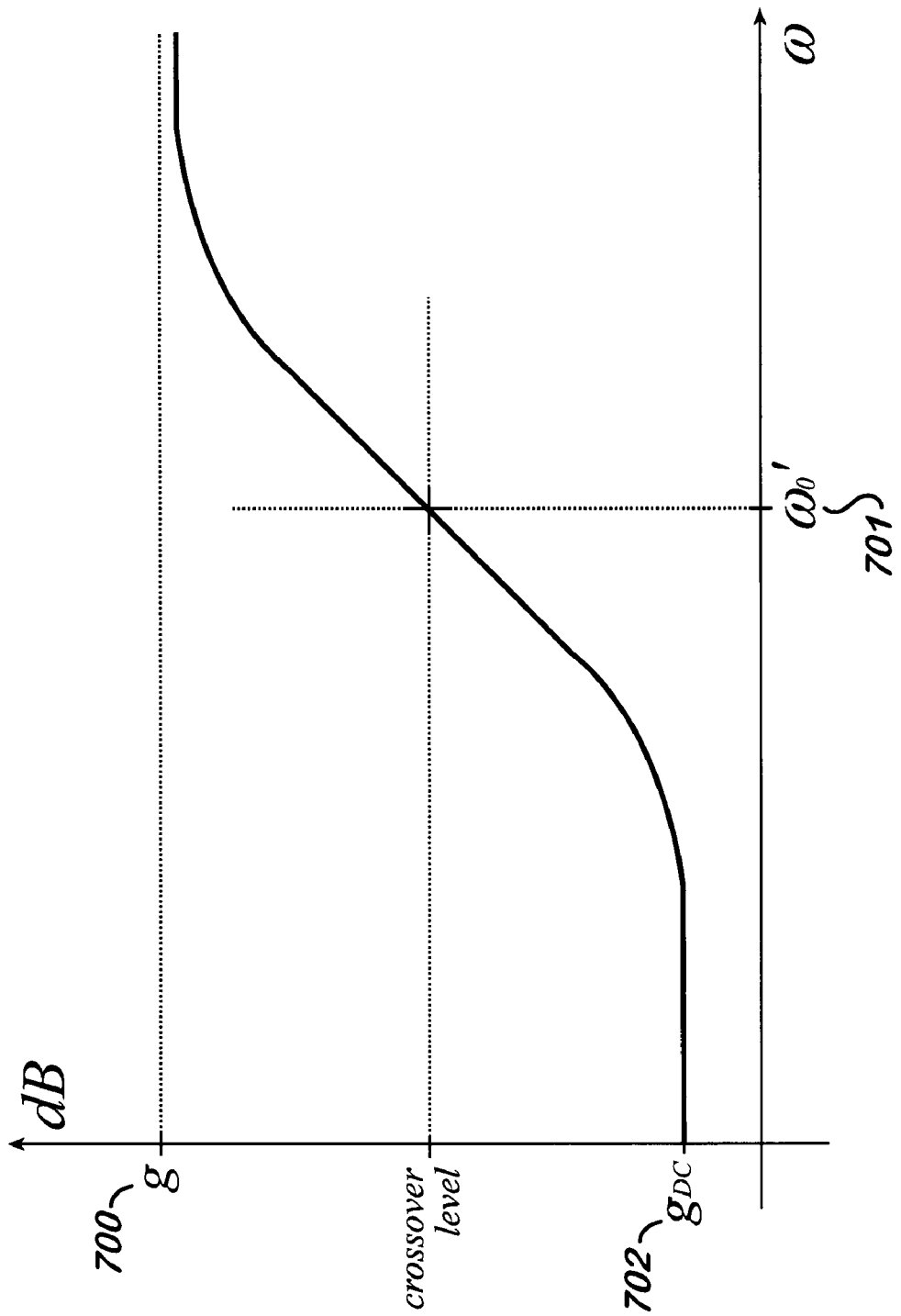
FIG. 7 is a graph of the frequency response of a tube amplifier stage.

Referring to FIG. 7, a frequency response graph of a typical tube amplifier stage is shown. When connected in the required negative-feedback arrangement, the low-pass characteristics of the R-C network in the feedback loop produce a high-shelf filter effect at the output. The choice of values for the forward gain 700, crossover frequency 701, and dc-gain 702 determine the values for RC and the feedback gain parameter, k.

Figure 8:
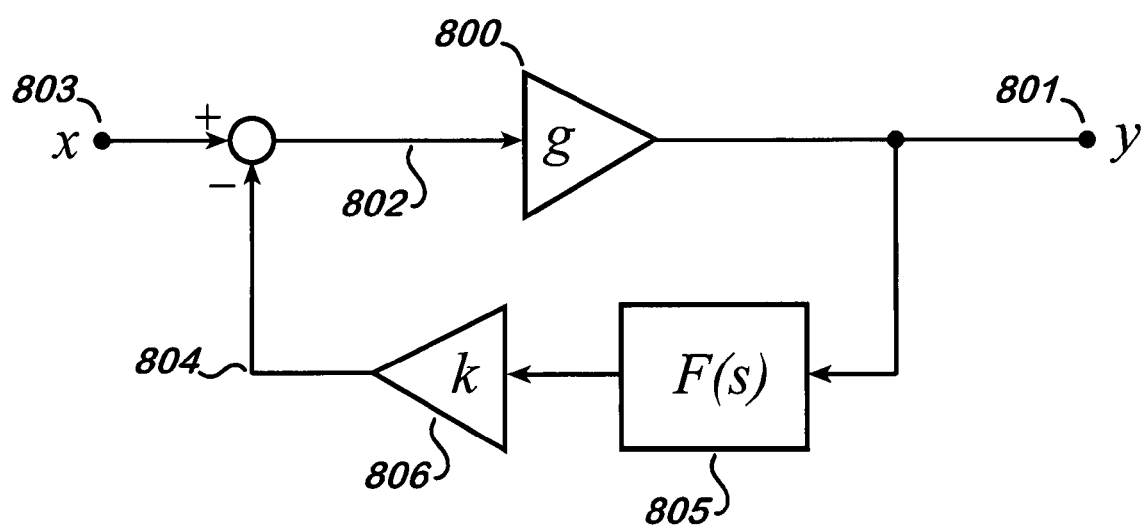
FIG. 8 is a signal flow diagram of a linear approximation to a non-linear filter.

Referring to FIG. 8, a signal flow diagram of a linear approximation to a non-linear filter is shown. Here, the non-linear transfer function has been replaced by a linear gain block 800 that feeds the output 801. Again, the input to the linear gain block 802 is derived from the difference of the system input 803 and the feedback signal 804. The feedback signal 804 is generated by filtering the output 801 with the linear filter block 805 and applying the feedback gain control 806. The filter in the feedback path 805, represented by F(s), typically mimics the first-order low-pass filter characteristics of the cathode-connected R-C network with a frequency response given by $$F(s) = \frac{\omega_0}{s + \omega_0},$$

where the cutoff frequency, $\omega_0$, is related to the values of the resistor and capacitor components of the R-C network by $$\omega_0 = \frac{1}{RC}.$$

Solving for the frequency response of the forward path of the entire system, represented by H(s), we obtain $$H(s) = \frac{g}{1 + gkF(s)},$$

where g represents the gain of the linear gain block 800 and k represents the gain of feedback control 806. Substituting for F(s) we obtain $$H(s) = \left(g \cdot \frac{s}{s + \omega_0'}\right) + \left(\frac{g}{1 + gk} \cdot \frac{\omega_0'}{s + \omega_0'}\right),$$

where $$\omega_0' = (1 + gk)\omega_0.$$

Here we see that the frequency response of the system is the sum of a low-pass filter section and a high-pass filter section with differing pass-band gains, resulting in a high-pass shelf filter with high-frequency gain equal to g and dc-gain equal to $g_{DC}$ where $$g_{DC} = \frac{g}{1 + gk}.$$

Note that the effective crossover frequency, $\omega_0'$, varies with g. With the forward linear gain block 800 replaced with a non-linear transfer function, where the instantaneous gain varies with amplitude, interesting dynamic filtering results. Furthermore, for given values of g, $g_{Dc}$, and $\omega_0'$, the values of RC and k can be computed by rearranging the above equations, $$RC = \frac{g}{\omega_0' g_{DC}}$$

$$k = \frac{1}{g_{DC}} - \frac{1}{g}.$$

and, thus, the relationship between the desired crossover frequency, forward gain, and dc-gain of the high-shelf filter to the values of the components in the feedback loop is demonstrated.

The emulation of the non-linear filter requires an algorithm that can simulate the effects of the forward-path non-linear transfer function, the feedback-path linear filter, and their interactions simultaneously. As previously shown, if the forward path non-linear transfer function were replaced with a linear function, the overall system frequency response could be described in closed form, allowing direct implementation in discrete-time by using the bilinear transform or other method to transform the continuous-time system into a discrete-time system suitable for digital signal processing. However, since the function in the forward path is non-linear, a simple closed form solution is not possible and standard methods for emulating continuous-time systems with discrete-time processing do not apply. The present invention solves this problem by describing the non-linear filter as a non-linear differential equation and utilizing a numerical method to solve the differential equation in real-time.

Referring again to FIG. 6, a signal flow block diagram representing a non-linear filter is shown. The current flowing out of the dependent current source 602 equals the sum of the currents flowing into the resistor and capacitor 601, resulting in the relationship, $$f(x - kv) = \frac{v}{R} + C\frac{dv}{dt},$$

which after rearranging we obtain $$\frac{dv}{dt} = \frac{1}{C}f(x - kv) - \frac{1}{RC}v.$$

This non-linear differential equation may be classified under a more general first-order differential equation described by $$\frac{dv}{dt} = f(x, v)$$

of which numerical solutions are readily obtainable through step-method numerical integration solvers.

Step method numerical integration solvers find the output to a differential equation after some step-period, h, given a set of initial conditions. In discrete-time systems, the step-period is typically some multiple of the sampling period, $T_s$, which allows for the solution of the next output sample from the previous output sample and the current input sample. The initial conditions in this case would be the current input sample, $x_n$, and previous value for the voltage across the R-C network, $v_{n-1}$. For each sampling interval, the numerical integration solver computes the next output sample, $y_n$, from these two initial conditions and updates the new initial condition, $v_n$, for the next sampling interval. This process is repeated for each sample interval producing a stream of output samples from a stream of input samples. If the processing time for each sample can be made less than the sampling period, this procedure can run in real-time.

One such step-method numerical integration solver that proves very effective in terms of the accuracy and efficiency of solving the above differential equations in real-time is the fourth-order Runge-Kutta algorithm. The fourth-order Runge-Kutta algorithm for a time-invariant equation is given by $$v_{n+1} = v_n + \frac{1}{6}(k_1 + 2k_2 + 2k_3 + k_4)$$

where $$k_1 = T_s f(x_n, v_n)$$

$$k_2 = T_s f\left(x_n, v_n + \frac{k_1}{2}\right)$$

$$k_3 = T_s f\left(x_n, v_n + \frac{k_2}{2}\right)$$

$$k_4 = T_s f(x_n, v_n + k_3).$$

The new output, $y_{n+1}$, can then be found easily from the new value of the R-C network voltage, $v_{n+1}$, given by $$y_{n+1} = f(x_n, v_{n+1}).$$

Thus, with only four evaluations of the non-linear transfer function, a new sample is derived from the previous sample and the initial conditions.

A beneficial side-effect of higher-order step-method numerical solvers is the inherent up-sampling and decimation filtering they provide. To avoid aliasing or fold-over noise, it is well known to employ up-sampling to increase the effective sampling rate of the system. This increases the internal processing bandwidth to avoid internal aliasing of the harmonics generated by distortion algorithms. Although the models presented in this invention may be used with this same up-sampling scheme for improved fold-over noise rejection, the step-method differential equation solver approach already incorporates a form of up-sampling extrapolation and interpolation that replaces much of the need for independent up-sampling, interpolation filter, and decimation filter blocks. The present invention, by providing a means of emulating a vacuum tube amplifier stage that inherently suppresses fold-over noise and aliasing, is far more efficient than systems that implement up-sampling and the associated filtering independently.

In addition to tube amplifier stages, it may be necessary to emulate the effects of tube power amplification stages in both class A and push-pull configurations. This introduces a new set of non-linear transfer functions that better emulate the effects of these power tubes, which may be used as independent signal processing blocks, or in conjunction with non-linear filter models.

Figure 9:
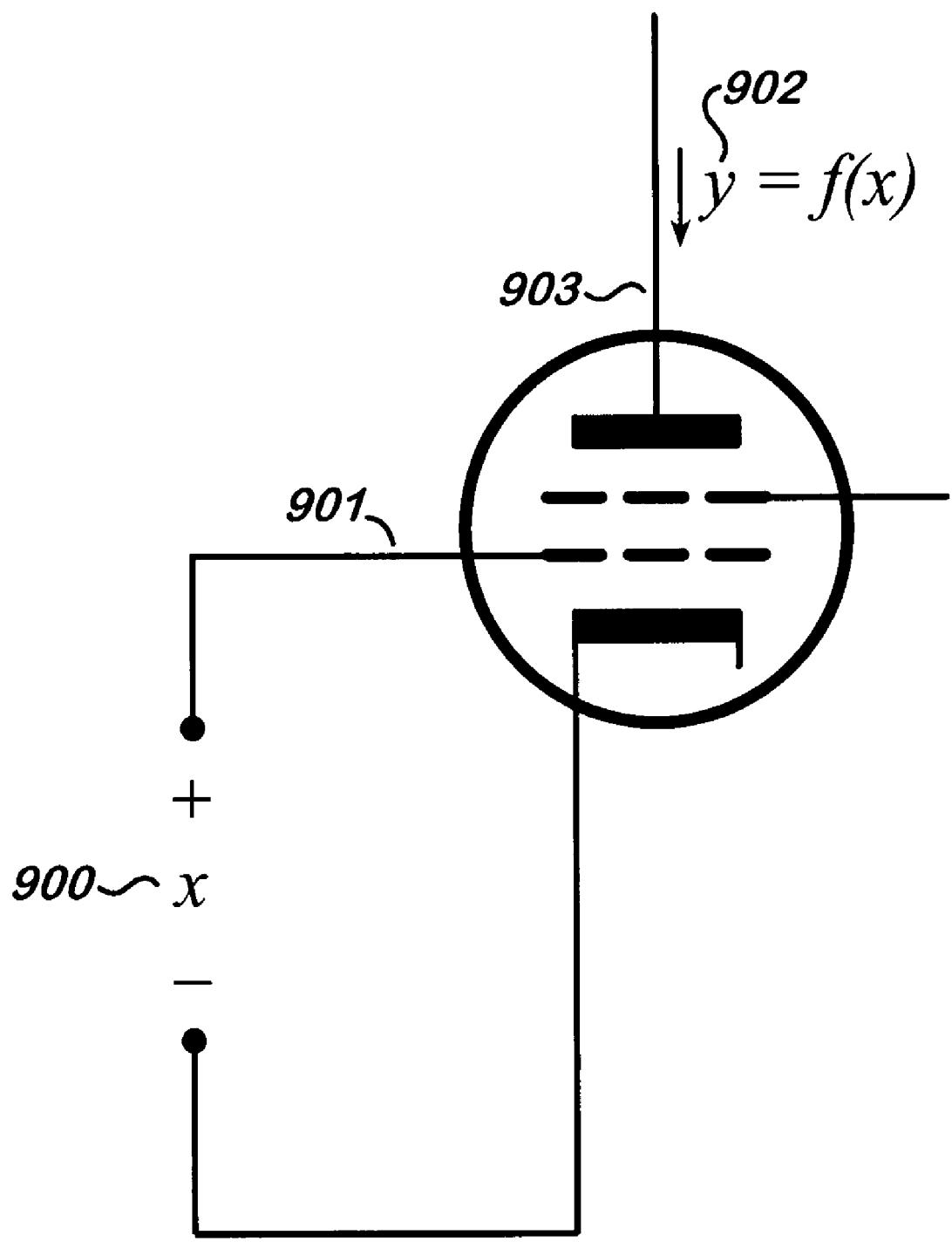
FIG. 9 is a schematic drawing of a single power tube.

Referring to FIG. 9, a schematic of a single power tube is shown. The input signal 900 feeds the grid 901 of the power tube and the output signal 902 is taken as the current flowing into the plate 903. The relationship between the grid voltage and plate current forms the basis of the emulation of tube power amplifier stages.

Figure 10:
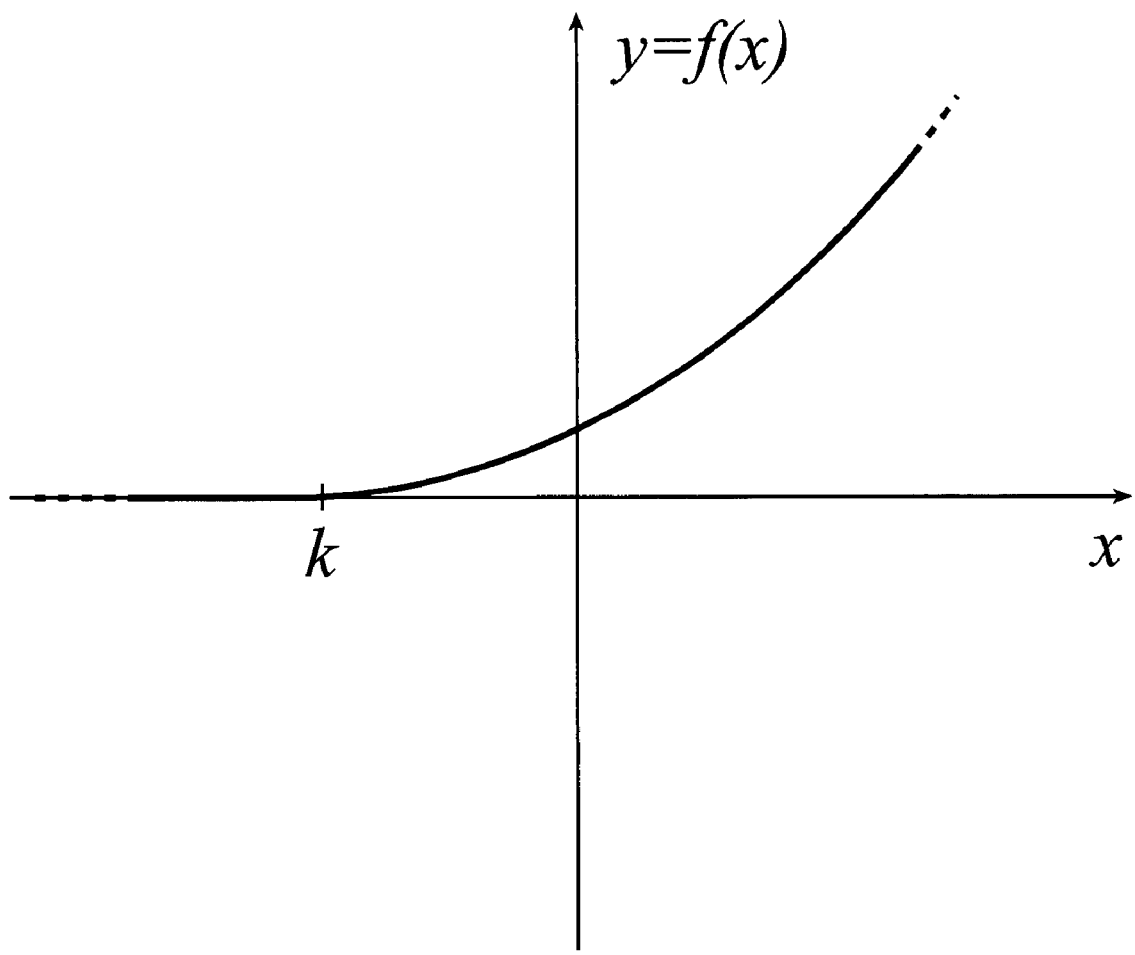
FIG. 10 is a graph of a simplified non-linear transfer function of a power tube.

Referring to FIG. 10, a graph of a simplified transfer function of a single power tube is shown. When the input, represented by the x-axis, is below a selected bias threshold parameter, represented by k, $$x < k,$$

the tube is said to be in cutoff and the output, represented by the y-axis, is zero, $$y = 0.$$

When the input exceeds k, $$x \geq k,$$

the tube begins to conduct and the output relates to the input by a power-law function describing a simplified model of the transfer characteristic curve of a power tube. This power-law is given by $$y = (x - k)^\alpha$$

where α represents an exponent greater than or equal to 1, and is typically equal to 1.5.

Figure 11:
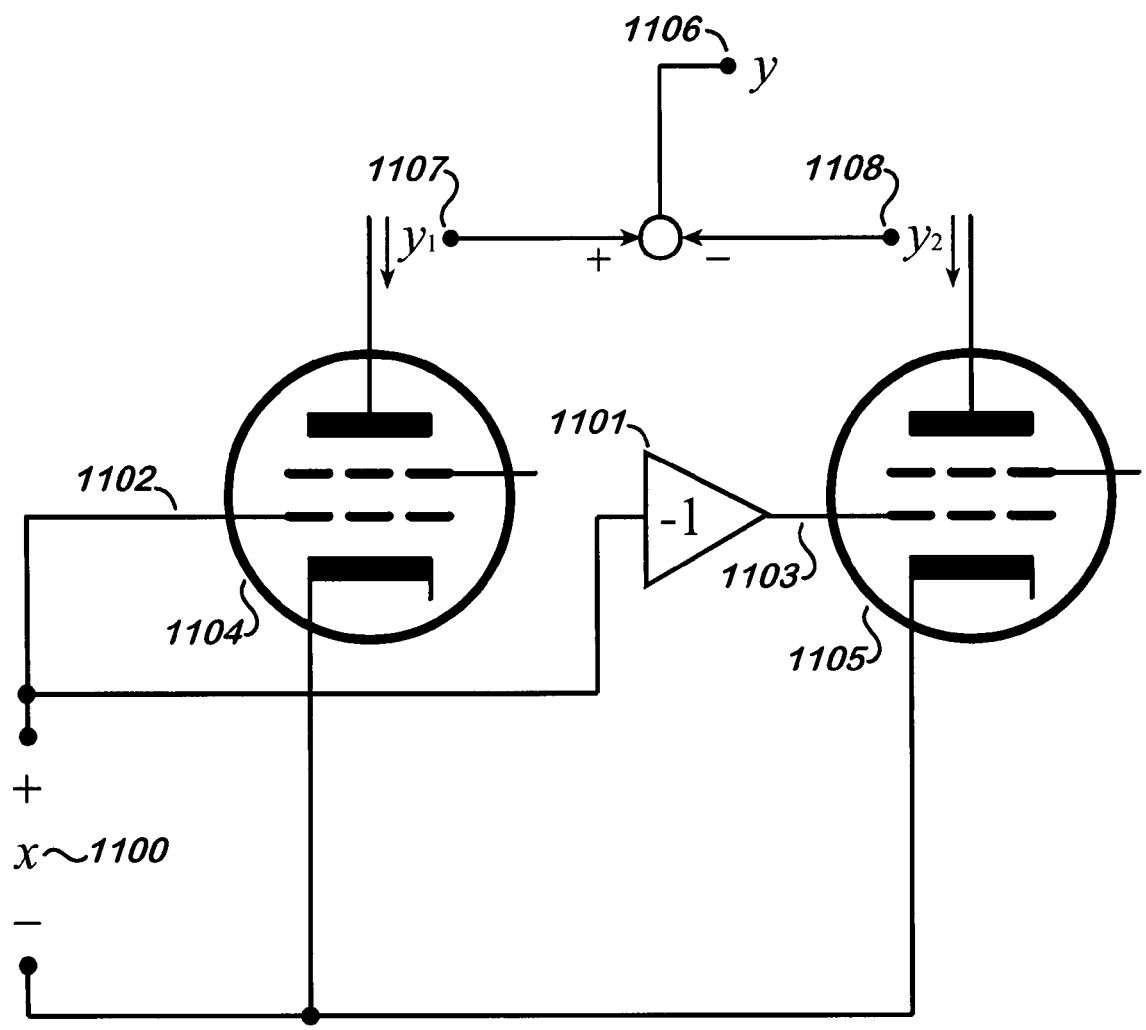
FIG. 11 is a schematic drawing of two power tubes in a push-pull configuration.

Referring to FIG. 11, a schematic of two power tubes wired in a push-pull configuration is shown. The input signal 1100 feeds a phase inverter 1101 to produce two signals, the in-phase input 1102 and the inverted-phase input 1103, driving the grids of the in-phase tube 1104 and inverted-phase tube 1105, respectively. The output signal 1106 is then taken as the difference in the plate current of the in-phase tube 1107 and the plate current of the inverted-phase tube 1108. As the input signal 1100 increases, the voltage on the grid of the in-phase tube 1102 increases while the voltage on the grid of the inverted-phase tube 1103 decreases, and, likewise, the plate current of the in-phase tube 1107 increases while the plate current of the inverted-phase tube 1108 decreases. For large positive values of the input signal 1100, the inverted-phase tube 1105 is cutoff and only the in-phase tube 1104 contributes to the output signal 1106. Similarly, for large negative values of the input signal 1100, the in-phase tube 1104 is cutoff and only the inverted-phase tube 1105 contributes to the output signal 1106. For small input signals, however, both tubes can be either cutoff or conducting, depending on the values of their respective bias threshold parameters. The choice of these bias threshold parameters affects the transfer functions of both tubes and determines the linearity and crossover distortion of their combined output for small signals.

Figure 12:
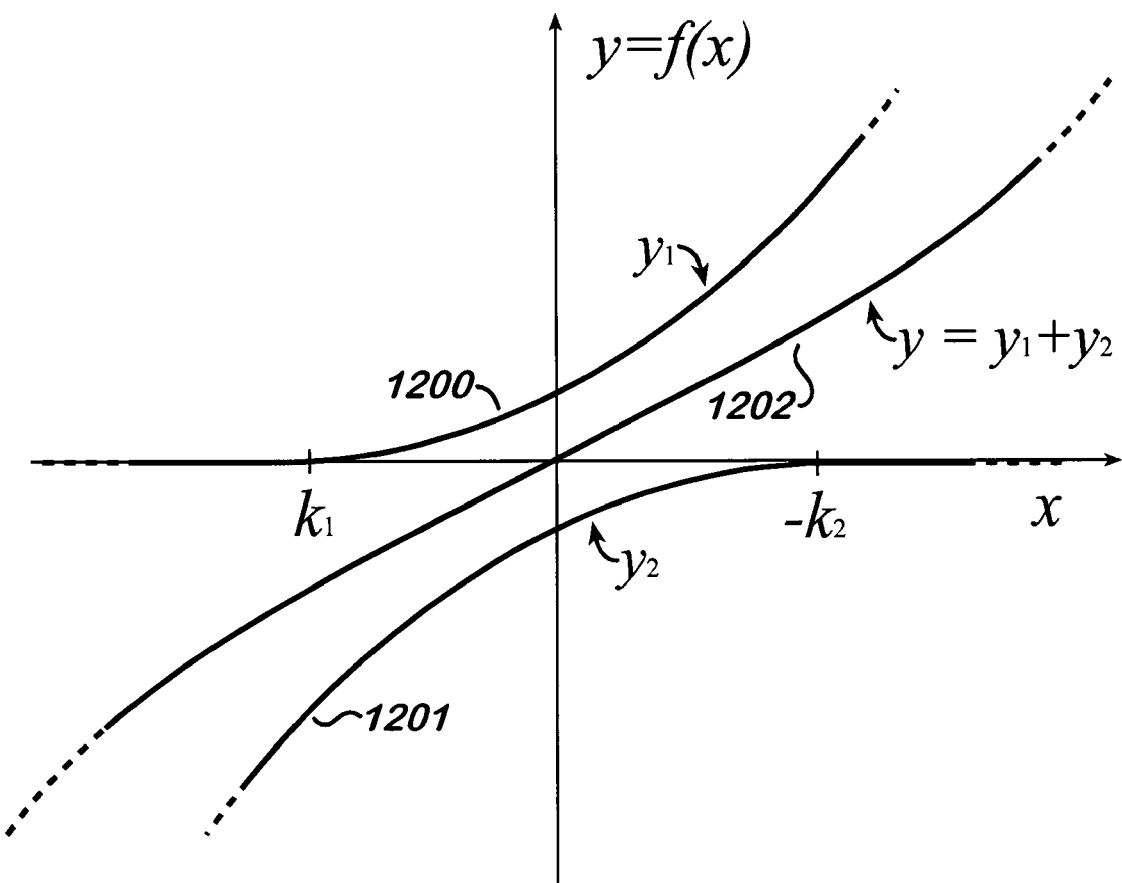
FIG. 12 is a graph of the non-linear transfer functions of a push-pull power amplifier model.

Referring to FIG. 12, the transfer functions of the tubes in a typical push-pull tube power amplifier are shown. Curve 1 1200 depicts the transfer function of the in-phase tube, referred to by $y_1$, and is defined by the power-law as described above, namely, $$y_1 = \begin{cases} (x-k_1)^\alpha, & x \geq k_1 \\ 0, & \text{otherwise} \end{cases},$$

where $k_1$ represents the bias threshold point for the in-phase tube. Curve 2 1201 depicts the transfer function of the inverted-phase tube, referred to by $y_2$. To accommodate the inverting effects of the inverted-phase tube, the power-law transfer function is inverted and flipped about the x-axis resulting in $$y_2 = \begin{cases} -(-x-k_2)^\alpha, & x \leq -k_2 \\ 0, & \text{otherwise} \end{cases},$$

where $k_2$ represents the bias threshold point for the inverted-phase tube. The output, referred to by y, is now the sum of the transfer functions of both power tubes, $$y = y_1 + y_2,$$

resulting in the overall output transfer function, $$y = \begin{cases} (x-k_1)^\alpha, & x \geq k_1 \\ (x-k_1)^\alpha - (-x-k_2)^\alpha, & k_1 < x < -k_2 \\ -(-x-k_2)^\alpha, & x \leq -k_2 \end{cases}$$

as depicted by curve 3 1202.

The selection of the bias threshold parameters, $k_1$ and $k_2$, will affect the nature of the overall output transfer function near the origin and will decide if the output experiences crossover distortion.

Figure 13:
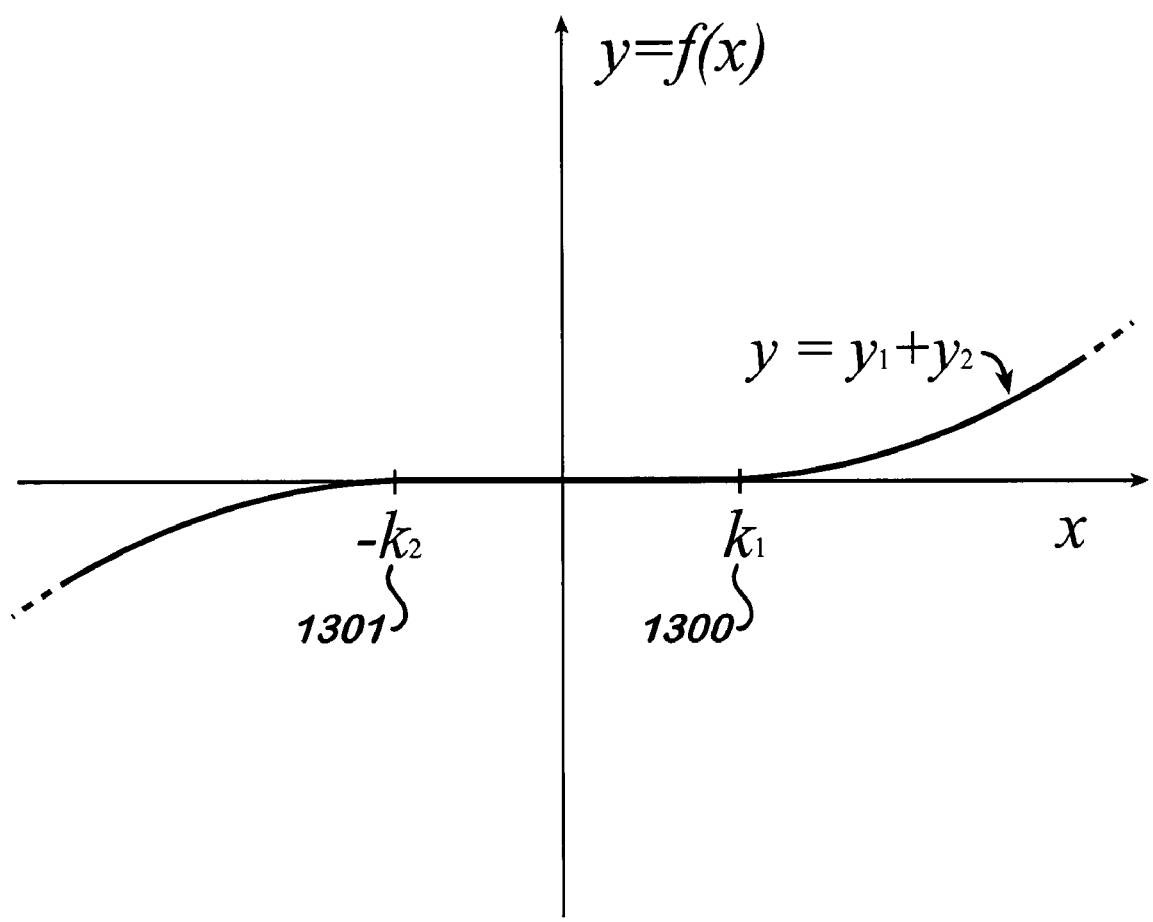
FIG. 13 is a graph of the non-linear transfer function of a push-pull power amplifier model configured with crossover distortion.

FIG. 13 shows the particular case when the bias threshold of the in-phase tube 1300 is greater than the bias threshold of the inverted-phase tube 1301, i.e.

$$k_1 \geq -k_2.$$

Here, the conducting portions of the transfer functions of the individual power tubes do not overlap. Both power tubes are in cutoff for input values between $-k_2$ and $k_1$, resulting in no output. The resulting overall output transfer function, $$y = \begin{cases} (x-k_1)^\alpha, & x \geq k_1 \\ 0, & -k_2 < x < k_1 \\ -(-x-k_2)^\alpha, & x \leq -k_2 \end{cases}$$

emulates the crossover distortion phenomenon found in push-pull tube power amplifiers.

As with the tube preamplifier stages, the tube power amplifier models may be scaled and offset to change the signal gain and bias. Likewise, the bias threshold parameter of the single tube power amplifier model and both bias threshold parameters of the push-pull tube power amplifier model can be modulated by the input envelope or other signal to recreate dynamic distortion effects.

Figure 14:
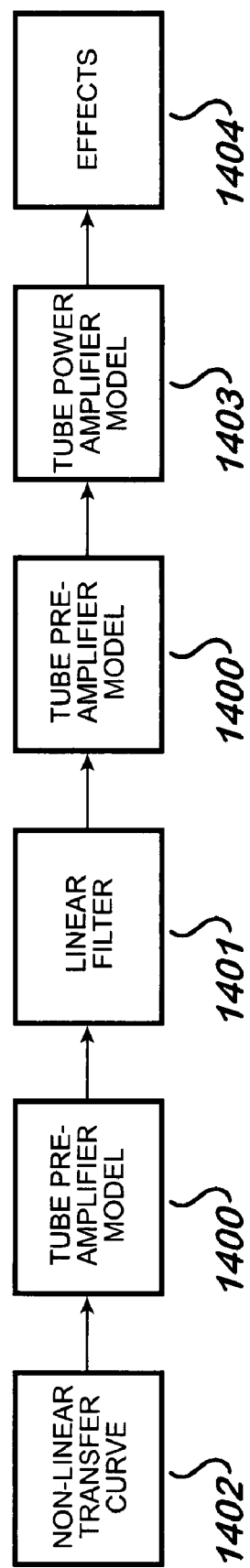
FIG. 14 is a signal flow block diagram of a plurality of tube models, filters, and effects.

Referring to FIG. 14, a signal flow block diagram depicting a plurality of tube amplifier stage models 1400, linear filters 1401, non-linear transfer functions 1402, tube power amplifier models 1403, and other effect stages 1404, is shown. In the present invention, several instances of tube amplifier and power amplifier stages may be used in conjunction with linear filters and other effects well known in the art to fully emulate distortion effects, tube amplification and guitar amplification systems. One of the main purposes of the parametric approach to modeling tube amplifier stages is ultimately to enable the parametric control of a full tube amplification system, comprising said stages and other effects. This gives musicians, recording engineers, and others the ability to configure and rearrange these components to emulate any tube amplifier they desire with ease.

There has been described and illustrated herein, a digital signal processing method for tube amplifier emulation. The method of the invention provides a means to emulate the distortion and dynamic characteristics of tube preamplifiers and tube power amplifiers in software running on a computer or other signal processing hardware. Transfer functions of tube preamplifier stages and tube power amplifiers have been described, along with means to use them in non-linear filters and differential equations. Methods of emulating these filters and equations have been presented and a plurality of these methods has been shown to provide a parametrically-controlled emulation of distortion effects, tube amplification and guitar amplification systems.

It is to be understood that the invention is not limited to the illustrated and described forms and embodiments contained herein. It will be apparent to those skilled in the art that various changes using different configurations and functionally equivalent components and programming may be made without departing from the scope of the invention. Thus, the invention is not considered limited to what is shown in the drawings and described in the specification and all such alternate embodiments are intended to be included in the scope of this invention as set forth in the following claims.

What is claimed is:

1. A digital distortion processor comprising:
   an input sample;
   an output sample;

a digital sample processor;

a first comparison function to determine if the said input sample is greater or less than a first threshold value;

a second comparison function to determine if the said input sample is greater or less than a second threshold value;

a negative clipping function to produce a negative clipping sample by dividing a first numerator sample by a first denominator sample, the said first numerator sample produced by adding the said input sample to a first coefficient, and the said first denominator sample produced by subtracting the said input sample from a second coefficient;

a positive clipping function to produce a positive clipping sample by dividing a second numerator sample by a second denominator sample, the said second numerator sample produced by adding the said input sample to a third coefficient, and the said second denominator sample produced by adding the said input sample to a fourth coefficient;

a linear function to produce a linear sample by multiplying the said input sample by a gain coefficient; and an output sample selector to select the said output sample, the said output sample selector selecting the said negative clipping sample when the said input sample is less than the said first threshold value, the said output sample selector selecting the said positive clipping sample when the said input sample is greater than the said second threshold value, and the said output sample selector selecting the said linear sample when the said input sample is both greater than the said first threshold value and less than the said second threshold value.

2. A digital distortion processor as in claim 1, further comprising:

a first coefficient function to compute the said first coefficient by squaring the said first threshold value;

a second coefficient function to compute the said second coefficient by adding twice the said first threshold value to one;

a third coefficient function to compute the said third coefficient by squaring the said second threshold value; and a fourth coefficient function to compute the said fourth coefficient by subtracting twice the said second threshold value from one.

3. A digital distortion processor as in claim 2, further comprising:

a symmetry control parameter; and an edge control parameter.

4. A digital distortion processor as in claim 3, further comprising:

a first threshold function to compute the said first threshold value by subtracting both the said edge control parameter and a product of the said edge control parameter and said symmetry control parameter from the said symmetry control parameter; and a second threshold function to compute the said second threshold value by subtracting a product of the said edge control parameter and the said symmetry control parameter from the sum of the said symmetry control parameter and the said edge control parameter.

5. A digital distortion processor as in claim 1, further comprising:

an input gain control parameter to scale the said input sample;

an output gain control parameter to scale the said output sample;

an input offset control parameter to add an offset value to the said input sample; and an output offset control parameter to add an offset value to the said output sample.

6. A digital non-linear filter processor comprising:

a digital distortion processor as in claim 1, 2, 3, 4, or 5;

a system output resulting from the output sample of said digital distortion processor;

a feedback network;

a feedback signal resulting from processing said system output with said feedback network;

a system input; and an input to the said digital distortion processor resulting from adding the said system input to the said feedback signal.

7. A digital non-linear filter processor as in claim 6, further comprising:

a linear filter to filter the said feedback signal.

8. A digital non-linear filter processor as in claim 7, further comprising:

a feedback gain control parameter to control a gain of the said linear filter; and a cutoff frequency control parameter to set a cutoff frequency of the said linear filter.

9. A digital non-linear filter processor as in claim 7, further comprising:

a DC gain control parameter;

a high-frequency gain control parameter;

a crossover frequency control parameter;

a feedback gain function to compute the said feedback gain control parameter from the said DC gain control parameter and the said high-frequency gain control parameter; and a cutoff frequency function to compute a cutoff frequency control parameter from the said DC gain control parameter, the said high-frequency gain control parameter, and the said crossover frequency control parameter.

10. A digital vacuum tube emulator comprising:

a digital non-linear filter processor as in claim 6; and a step-method numerical integration solver function to compute solutions to the said digital non-linear filter processor.

11. The digital vacuum tube emulator in claim 10 wherein said step-method numerical integration solver function is one of a first-order Euler solver function, a second-order Runge-Kutta solver function, or a fourth-order Runge-Kutta solver function.

12. A digital power vacuum tube emulator comprising:

an input sample;

an output sample;

a digital sample processor;

a comparison function to determine if the said input sample is greater or less than a threshold value;

a power-law function to produce a processed sample by raising a difference of the said input sample and the said threshold value to the power of an exponent value; and an output sample selector to select the said output sample, the said output sample selector selecting the said processed sample when the said input sample is greater than the said threshold value, and the said output sample selector selecting a zero value when the said input sample is less than the said threshold value.

13. A digital power vacuum tube emulator as in claim 12, further comprising:

a modulating signal input used to control and set the said threshold value.

14. A digital power vacuum tube emulator as in claim 12, further comprising:

an input gain control parameter to scale the said input sample;

an output gain control parameter to scale the said output sample;

an input offset control parameter to add an offset value to the said input sample;

an output offset control parameter to add an offset value to the said output sample; and an input offset modulating signal input used to control and set the said input offset control parameter.

15. A digital power vacuum tube amplifier emulator comprising:

a non-inverting power tube function comprising a power vacuum tube emulator as in claim 12;

an inverting power tube function comprising a power vacuum tube emulator as in claim 12;

a system input signal directly feeding the said non-inverting power tube function;

an inverted system input signal feeding the said inverting power tube function; and an output signal resulting from a difference in the output sample of the said non-inverting power tube function and the output sample of the said inverting power tube function.

16. A digital power vacuum tube amplifier emulator as in claim 15, further comprising:

an input gain control parameter to scale the said system input signal and said inverted system input signal;

an output gain control parameter to scale the said output signal;

an input offset control parameter to add an offset value to the said system input signal and said inverted system input signal; and an output offset control parameter to add an offset value to the said output signal.

17. A digital power vacuum tube amplifier emulator as in claim 15, further comprising:

a threshold adjustment control to adjust the said threshold values of the said non-inverting power tube function and the said inverting power tube function; and a threshold modulating input signal used to control and set the said threshold adjustment control.

* * * * *